(12) United States Patent
Lee et al.

(10) Patent No.: US 10,840,355 B2
(45) Date of Patent: Nov. 17, 2020

(54) INCREASING SOURCE/DRAIN DOPANT CONCENTRATION TO REDUCED RESISTANCE

(71) Applicant: Taiwan Semiconductor Manufacturing Company, Ltd., Hsinchu (TW)

(72) Inventors: Yi-Jing Lee, Hsinchu (TW); Ming-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/967,672

(22) Filed: May 1, 2018

(65) Prior Publication Data

US 2019/0341472 A1 Nov. 7, 2019

(51) Int. Cl.
*H01L 29/66* (2006.01)
*H01L 29/06* (2006.01)
*H01L 21/02* (2006.01)
*H01L 29/08* (2006.01)
*H01L 29/78* (2006.01)
(Continued)

(52) U.S. Cl.
CPC .... *H01L 29/66795* (2013.01); *H01L 21/0262* (2013.01); *H01L 21/02532* (2013.01); *H01L 21/02579* (2013.01); *H01L 29/0649* (2013.01); *H01L 29/0847* (2013.01); *H01L 29/167* (2013.01); *H01L 29/36* (2013.01); *H01L 29/6656* (2013.01); *H01L 29/66545* (2013.01); *H01L 29/66636* (2013.01); *H01L 29/7851* (2013.01); *H01L 21/28088* (2013.01);
(Continued)

(58) Field of Classification Search
CPC ......... H01L 29/66795; H01L 29/66636; H01L 29/6656; H01L 29/7851; H01L 21/30604; H01L 21/3065; H01L 21/28088
See application file for complete search history.

(56) References Cited

U.S. PATENT DOCUMENTS 9,449,885 B1 * 9/2016 Reznicek .............. H01L 21/845
10,026,843 B2 7/2018 Lin et al.
(Continued)

FOREIGN PATENT DOCUMENTS

TW 201419527 A 5/2014
TW 201719731 A 6/2017

*Primary Examiner* — Charles D Garber
*Assistant Examiner* — S M Sohel Imtiaz
(74) *Attorney, Agent, or Firm* — Slater Matsil, LLP

(57) ABSTRACT

A method includes recessing a semiconductor fin to form a recess, wherein the semiconductor fin protrudes higher than isolation regions on opposite sides of the semiconductor fin, and performing a first epitaxy to grow a first epitaxy layer extending into the recess. The first epitaxy is performed using a first process gas comprising a silicon-containing gas, silane, and a phosphorous-containing gas. The first epitaxy layer has a first phosphorous atomic percentage. The method further includes performing a second epitaxy to grow a second epitaxy layer extending into the recess and over the first epitaxy layer. The second epitaxy is performed using a second process gas comprising the silicon-containing gas, silane, and the phosphorous-containing gas. The second epitaxy layer has a second phosphorous atomic percentage higher than the first phosphorous atomic percentage.

20 Claims, 17 Drawing Sheets

(51) Int. Cl.
  *H01L 29/167* (2006.01)
  *H01L 29/36* (2006.01)
  *H01L 29/49* (2006.01)
  *H01L 21/3065* (2006.01)
  *H01L 21/306* (2006.01)
  *H01L 21/28* (2006.01)

(52) U.S. Cl.
  CPC .... *H01L 21/3065* (2013.01); *H01L 21/30604* (2013.01); *H01L 29/4966* (2013.01)

(56) References Cited

U.S. PATENT DOCUMENTS

| | | | |
|---|---|---|---|
| 2005/0164463 A1* | 7/2005 | Speyer | H01L 29/66272 438/309 |
| 2013/0234203 A1 | 9/2013 | Tsai et al. | |
| 2014/0134818 A1 | 5/2014 | Cheng et al. | |
| 2014/0134822 A1* | 5/2014 | Srinivasan | H01L 29/66795 438/382 |
| 2014/0273379 A1* | 9/2014 | Tsai | H01L 21/02532 438/283 |
| 2015/0021690 A1* | 1/2015 | Jacob | H01L 21/02532 257/347 |
| 2015/0041852 A1 | 2/2015 | Kwok et al. | |
| 2015/0206939 A1* | 7/2015 | Huang | H01L 29/7848 257/77 |
| 2016/0056290 A1* | 2/2016 | Tsai | H01L 29/7833 257/192 |
| 2016/0104776 A1* | 4/2016 | Ching | H01L 27/0924 257/401 |
| 2016/0190137 A1* | 6/2016 | Tsai | H01L 27/0924 257/369 |
| 2017/0077244 A1* | 3/2017 | Chang | H01L 29/66795 |
| 2018/0083109 A1 | 3/2018 | Yu et al. | |
| 2018/0211881 A1* | 7/2018 | Zhang | H01L 29/7831 |
| 2019/0164809 A1* | 5/2019 | Meyer | H01L 21/82387 |

* cited by examiner

US 10,840,355 B2

INCREASING SOURCE/DRAIN DOPANT CONCENTRATION TO REDUCED RESISTANCE

BACKGROUND

Technological advances in Integrated Circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, Fin Field-Effect Transistors (FinFETs) have been introduced to replace planar transistors. The structures of FinFETs and methods of fabricating FinFETs are being developed.

FinFETs are formed based on semiconductor fins. The source and drain regions of FinFETs may be formed by etching some portions of semiconductor fins on opposite sides of gates, and then growing suitable materials in the spaces left by the etched portions of semiconductor fins.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 9A and 9B illustrate the cross-sectional views and perspective views of intermediate stages in the formation of a Fin Field-Effect Transistor (FinFET) in accordance with some embodiments.

DETAILED DESCRIPTION

Figure 1:
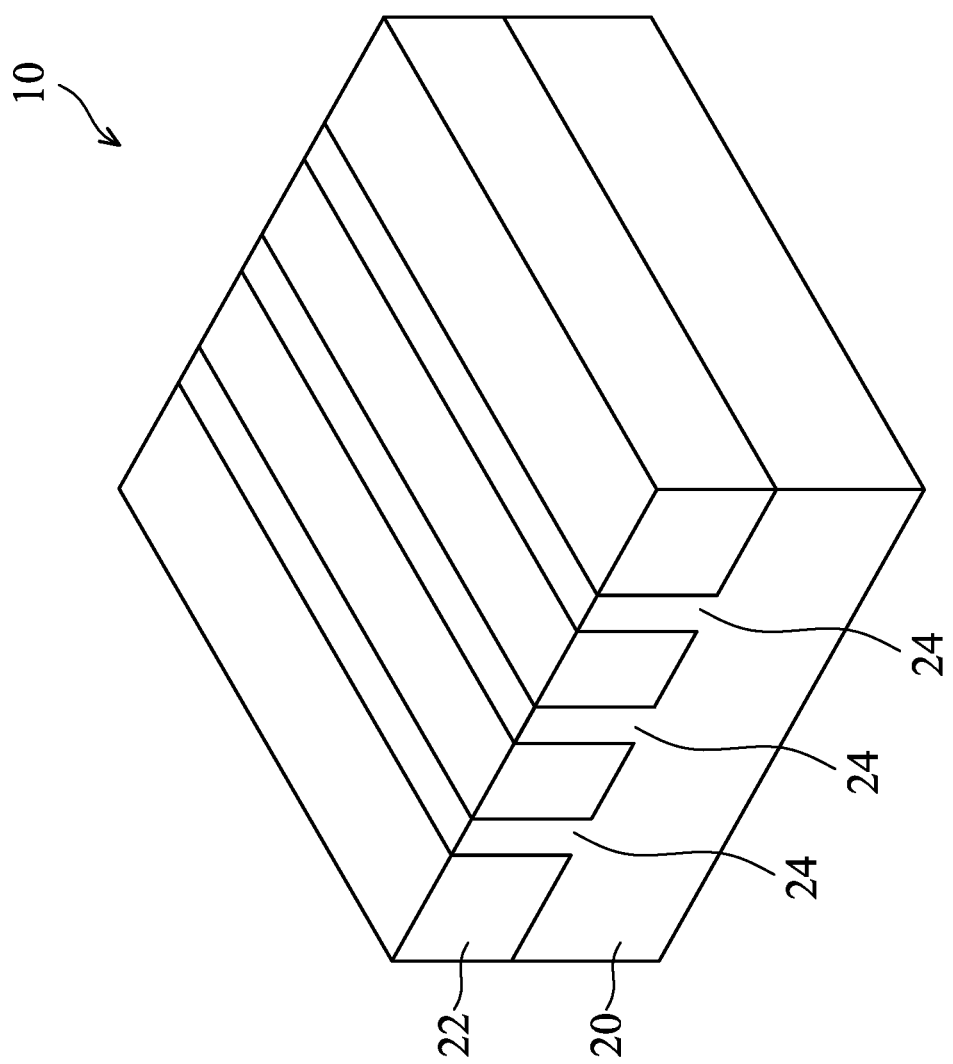

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A transistor and the methods of forming the same are provided in accordance with some embodiments. The intermediate stages of forming the transistor are illustrated in accordance with some embodiments. Some variations of some embodiments are discussed. Throughout the various views and illustrative embodiments, like reference numbers are used to designate like elements. In the illustrated embodiments, the formation of a Fin Field-Effect Transistor (FinFET) is used as an example to explain the concept of the present disclosure. Planar transistors may also adopt the concept of the present disclosure.

Figure 11:
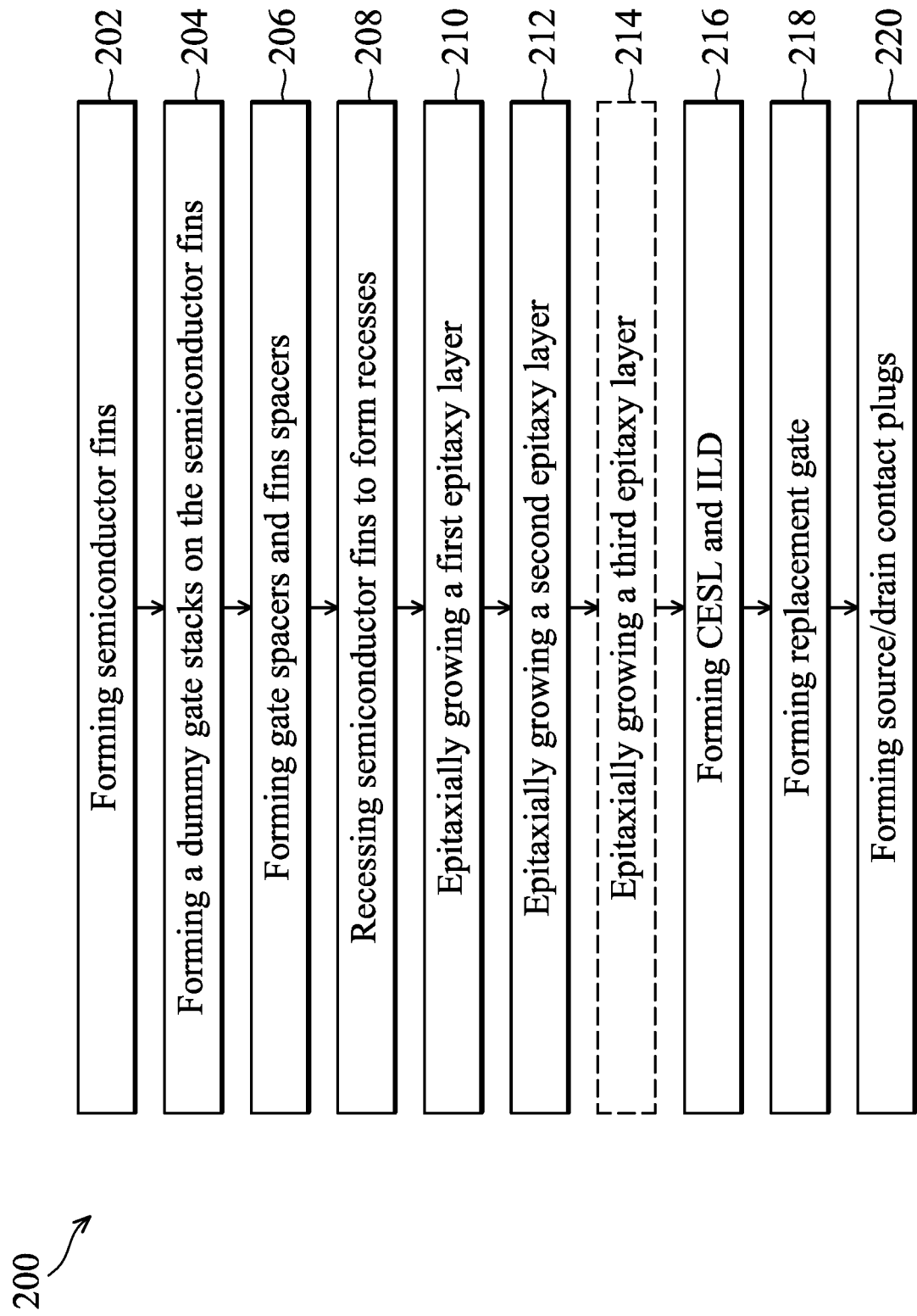
FIG. 11 illustrates a process flow for forming FinFETs in accordance with some embodiments.

FIGS. 1 through 9A and 9B illustrate the perspective views and cross-sectional views of intermediate stages in the formation of a FinFET in accordance with some embodiments of the present disclosure. The steps shown in FIGS. 1 through 9A and 9B are also reflected schematically in the process flow shown in FIG. 11.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The portions of substrate 20 between neighboring STI regions 22 are referred to as semiconductor strips 24. The top surfaces of semiconductor strips 24 and the top surfaces of STI regions 22 may be substantially level with each other in accordance with some embodiments.

STI regions 22 may include a liner oxide (not shown), which may be a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on, or the like.

Figure 2:
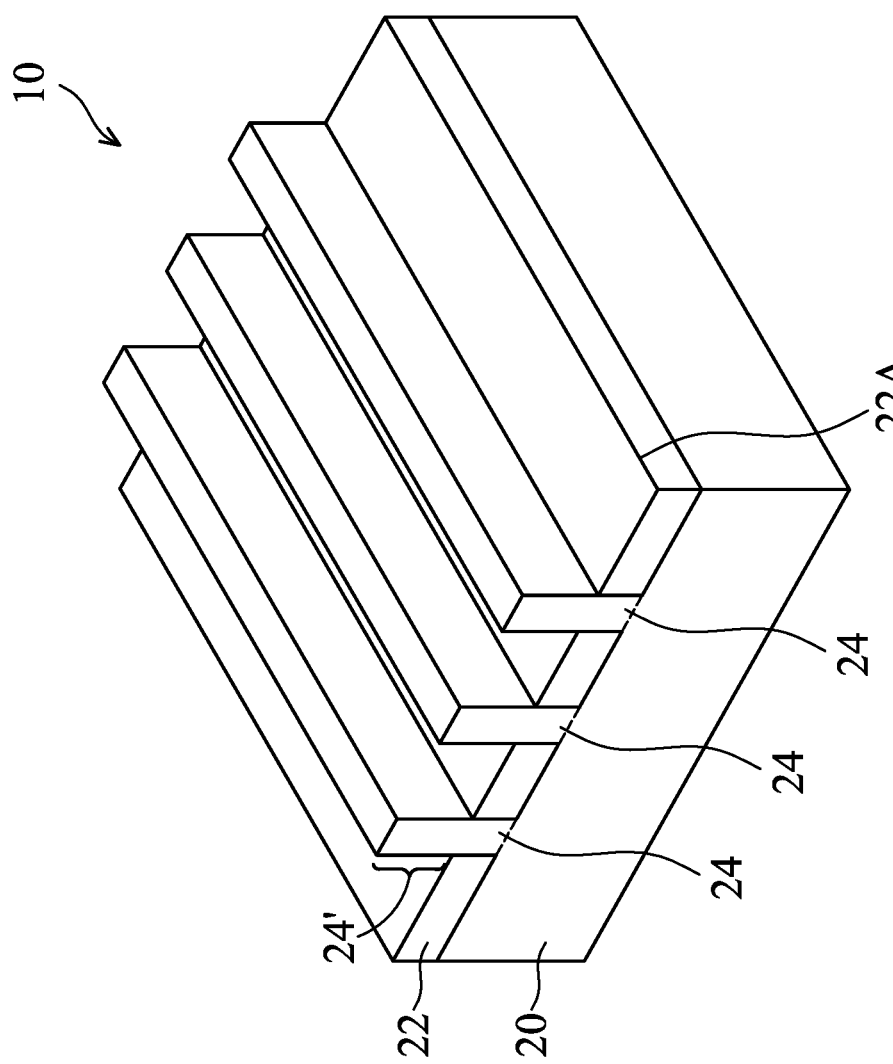

Referring to FIG. 2, STI regions 22 are recessed, so that the top portions of semiconductor strips 24 protrude higher than the top surfaces 22A of STI regions 22 to form protruding fins 24'. The respective process is illustrated as process 202 in the process flow shown in FIG. 11. The portions of semiconductor strips 24 in STI regions 22 are still referred to as semiconductor strips. The etching may be performed using a dry etching process, wherein a mixture of HF and $NH_3$ may be used as the etching gases. The etching may also be performed using a mixture of $NF_3$ and $NH_3$ as the etching gases. During the etching process, plasma may be generated. Argon may also be included. In accordance with alternative embodiments of the present disclosure, the recessing of STI regions 22 is performed using a wet etch process. The etching chemical may include HF solution, for example.

In accordance with some embodiments, the fins for forming the FinFETs may be formed/patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 3A:
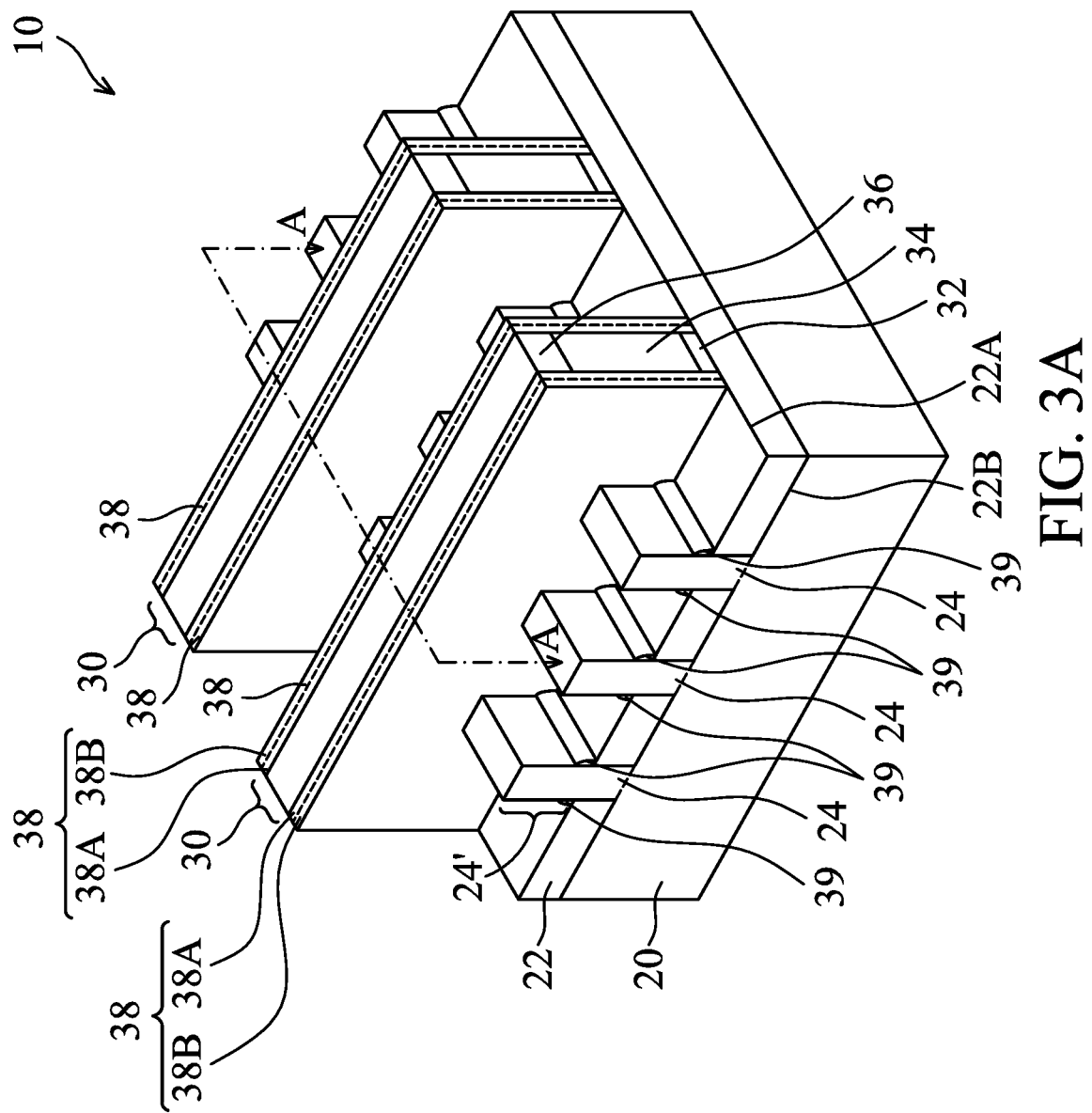

Referring to FIG. 3A, dummy gate stacks 30 are formed on the top surfaces and the sidewalls of protruding fins 24'. The respective process is illustrated as process 204 in the process flow shown in FIG. 11. It is appreciated that although two dummy gate stacks 30 are illustrated for clarity, there may be a single or more than two dummy gate stacks formed, which are parallel to each other, with the plurality of dummy gate stacks crossing the same semiconductor fin(s) 24'. Dummy gate stacks 30 may include dummy gate dielectrics 32 and dummy gate electrodes 34 over dummy gate dielectrics 32. Dummy gate electrodes 34 may be formed using, for example, amorphous silicon or polysilicon, and other materials may also be used. Each of dummy gate stacks 30 may also include one (or a plurality of) hard mask layer 36 over dummy gate electrode 34. Hard mask layers 36 may be formed of silicon nitride, silicon carbo-nitride, or the like. Dummy gate stacks 30 also have lengthwise directions perpendicular to the lengthwise directions of protruding fins 24'.

Next, gate spacers 38 are formed on the sidewalls of dummy gate stacks 30. The respective process is illustrated as process 206 in the process flow shown in FIG. 11. In accordance with some embodiments of the present disclosure, gate spacers 38 are formed of dielectric materials such as silicon carbon-oxynitride (SiCN), silicon nitride, or the like, and may have a single-layer structure or a multi-layer structure including a plurality of dielectric layers.

In accordance with some embodiments of the present disclosure, gate spacers 38 are multi-layer gate spacers, and the formation of multi-layer gate spacers include blanket depositing a first dielectric layer (such as 38A) and a second dielectric layer (such as 38B) over the first dielectric layer 38A, and then performing anisotropic etches to remove the horizontal portions of the dielectric layers 38A and 38B. The remaining portions of the dielectric layers are gate spacers 38. Dielectric layers 38A may have L-shaped cross-sectional views, with dielectric layers 38B overlapping the horizontal legs of the respective dielectric layers 38A. For example, gate spacers 38 may include silicon oxide layers 38A and silicon nitride layers 38B on the respective silicon oxide layers 38A. In accordance with some embodiments of the present disclosure, gate spacers 38 include low-k dielectric layers 38A and non-low-k dielectric layers 38B on the horizontal legs of the respective low-k dielectric layers 38A. Low-k dielectric layers 38A may be formed of a low-k dielectric material having a dielectric constant (k value) lower than about 3.5, which may be formed of SiON or SiOCN, with pores formed therein in order to reduce its k value to a desired low-k value. Non-low-k dielectric layers 38B may be formed of silicon nitride, for example.

FIG. 3A also illustrates fin spacers 39 formed on the sidewalls of protruding fins 24'. In accordance with some embodiments of the present disclosure, fin spacers 39 are formed simultaneously as gate spacers 38. The respective process is also illustrated as process 206 in the process flow shown in FIG. 11. For example, in the process for forming gate spacers 38, the blanket dielectric layer(s) that are deposited for forming gate spacers 38, when etched, may have some portions left on the sidewalls of protruding fins 24', hence forming fin spacers 39. In accordance with alternative embodiments, in the etching for forming gate spacers 38, the vertical portions of the dielectric layer on the sidewalls of protruding fins 24' are fully removed, hence no fin spacers are formed.

Figure 3B:
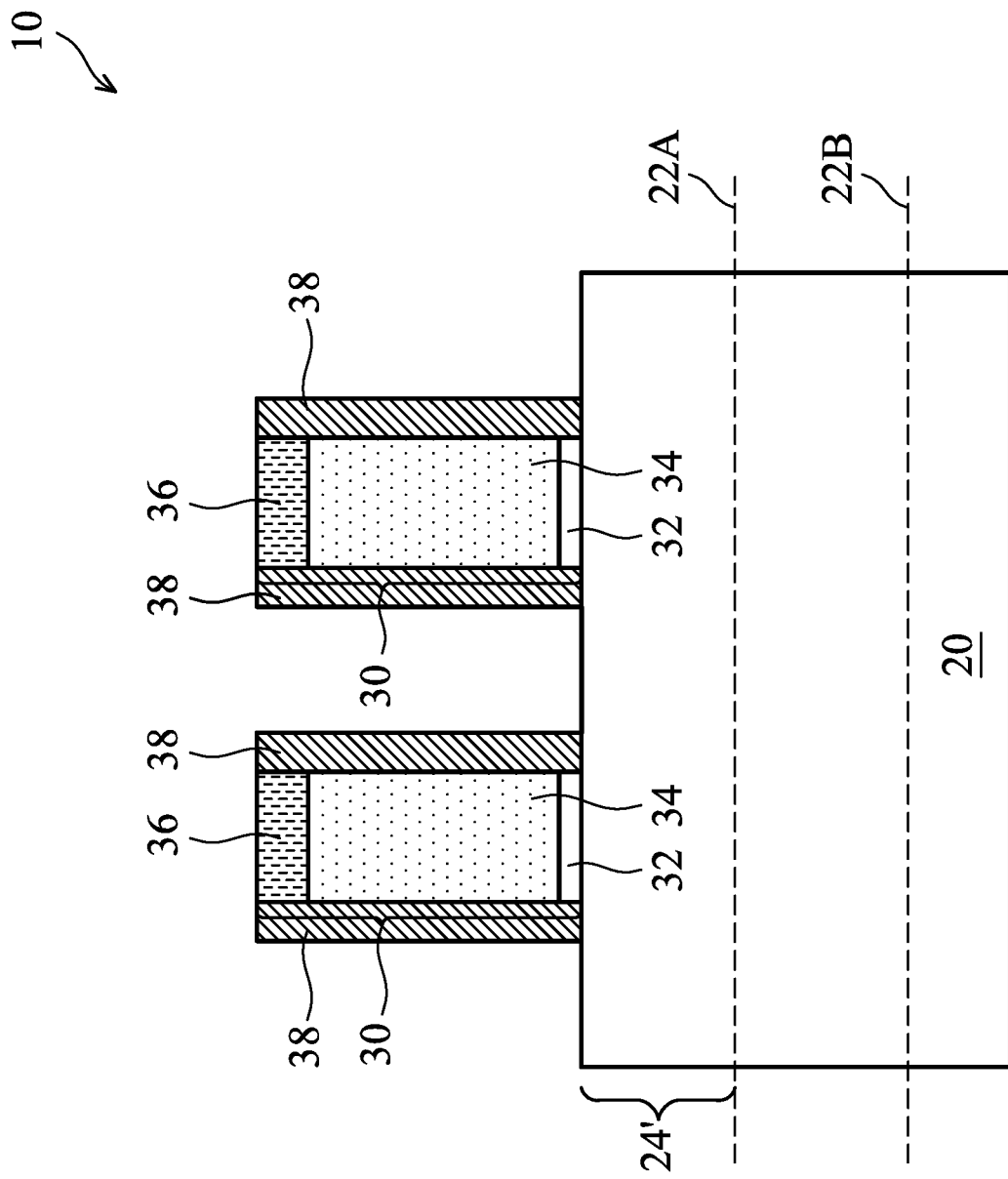

FIG. 3B illustrates a cross-sectional view of the structure shown in FIG. 3A, and the cross-sectional view is obtained from the vertical plane containing arrows A-A in FIG. 3A. In FIG. 3B and subsequent figures that illustrate cross-sectional views, the level of the top surfaces 22A of STI regions 22 (FIG. 3A) are illustrated, and semiconductor fin 24' is higher than top surfaces 22A. Bottom surfaces 22B (FIG. 3A) of STI regions 22 are also illustrated in the cross-sectional views. STI regions 22 are locate at the level between top surfaces 22A and 22B, and are not shown in the cross-sectional views since they are in different planes than illustrated.

Referring back to FIG. 3A, an etching step (also referred to as source/drain recessing hereinafter) is performed to recess the portions of protruding fins 24' that are not covered by dummy gate stacks 30 and gate spacers 38, resulting in the structure shown in FIG. 4A. The respective process is illustrated as process 208 in the process flow shown in FIG. 11. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. Recesses 40 are accordingly formed between STI regions 22. Recesses 40 are also located on opposite sides of dummy gate stacks 30. In accordance with some embodiments of the present disclosure, recesses 40 extend into STI regions 22 for depth D1, which may be in the range between about 5 nm and about 20 nm. The bottom surfaces of recesses 40 may be higher than the bottom surfaces 22B of STI regions 22, and lower than top surfaces 22A of STI regions 22.

In accordance with some embodiments of the present disclosure, the recessing is performed through a dry etching step. The dry etching may be performed using process gases such as $C_2F_6$, (with plasma), $CF_4$, $SO_2$, the mixture of HBr, $Cl_2$, and $O_2$, or the mixture of HBr, $Cl_2$, $O_2$, and $CF_2$ etc. In accordance with alternatively embodiments of the present disclosure, the recessing is performed through a wet etching step. The wet etching may be performed using KOH, tetramethylammonium hydroxide (TMAH), $CH_3COOH$, $NH_4OH$, $H_2O_2$, Isopropanol (IPA), or the solution of HF, $HNO_3$, and $H_2O$.

Figure 4A:
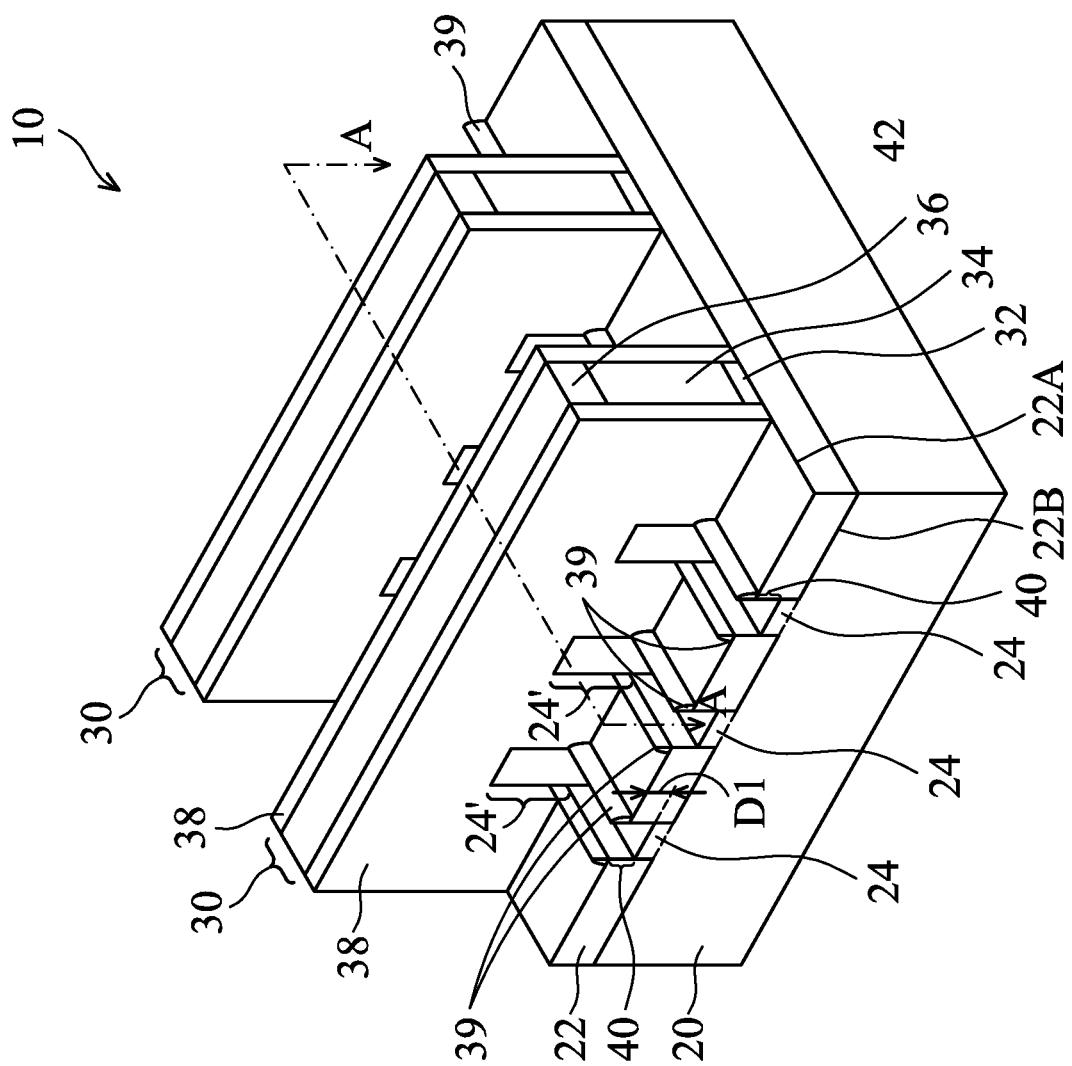
Figure 4B:
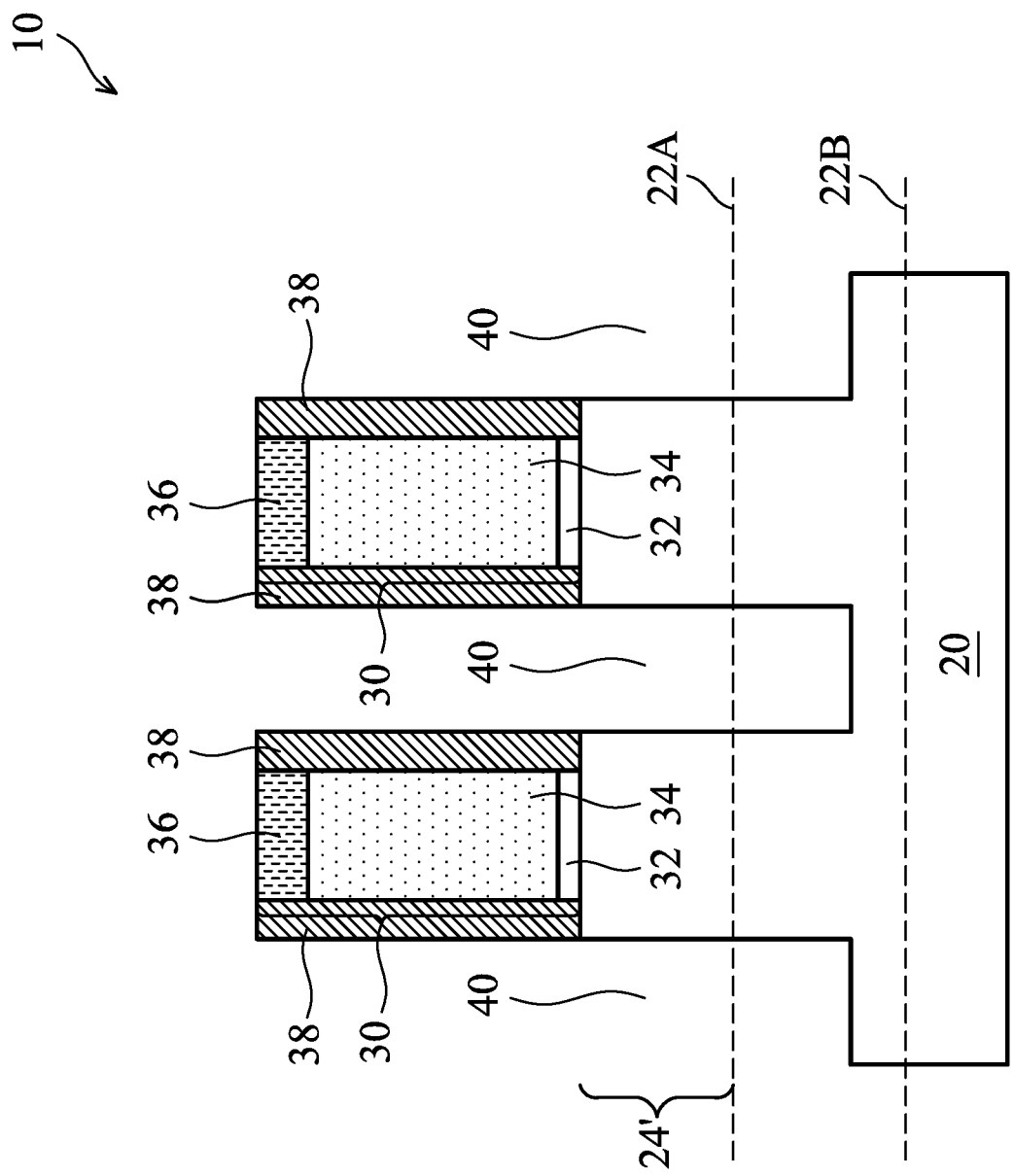

FIG. 4B illustrates a cross-sectional view of the structure shown in FIG. 4A, and the cross-sectional view is obtained from the vertical plane containing arrows A-A in FIG. 4A. In accordance with some embodiments of the present disclosure, as shown in FIG. 4B, recesses 40 have substantially vertical edges, which are substantially flushed with the outer edges of gate spacers 38. In accordance with other embodiments of the present disclosure, recesses 40 may extend underlying gate spacers 38 slightly.

Figure 5:
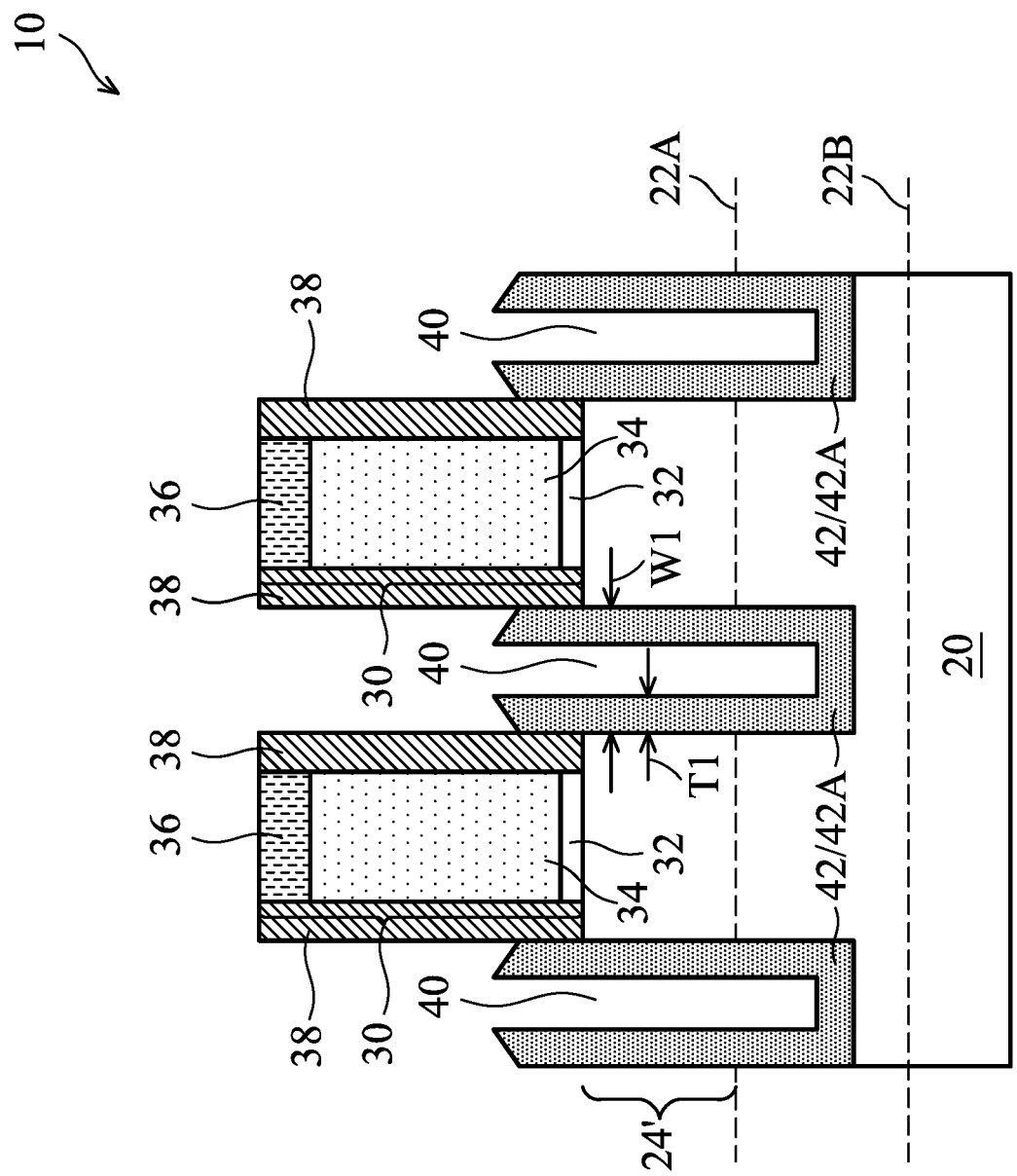
Figure 6:
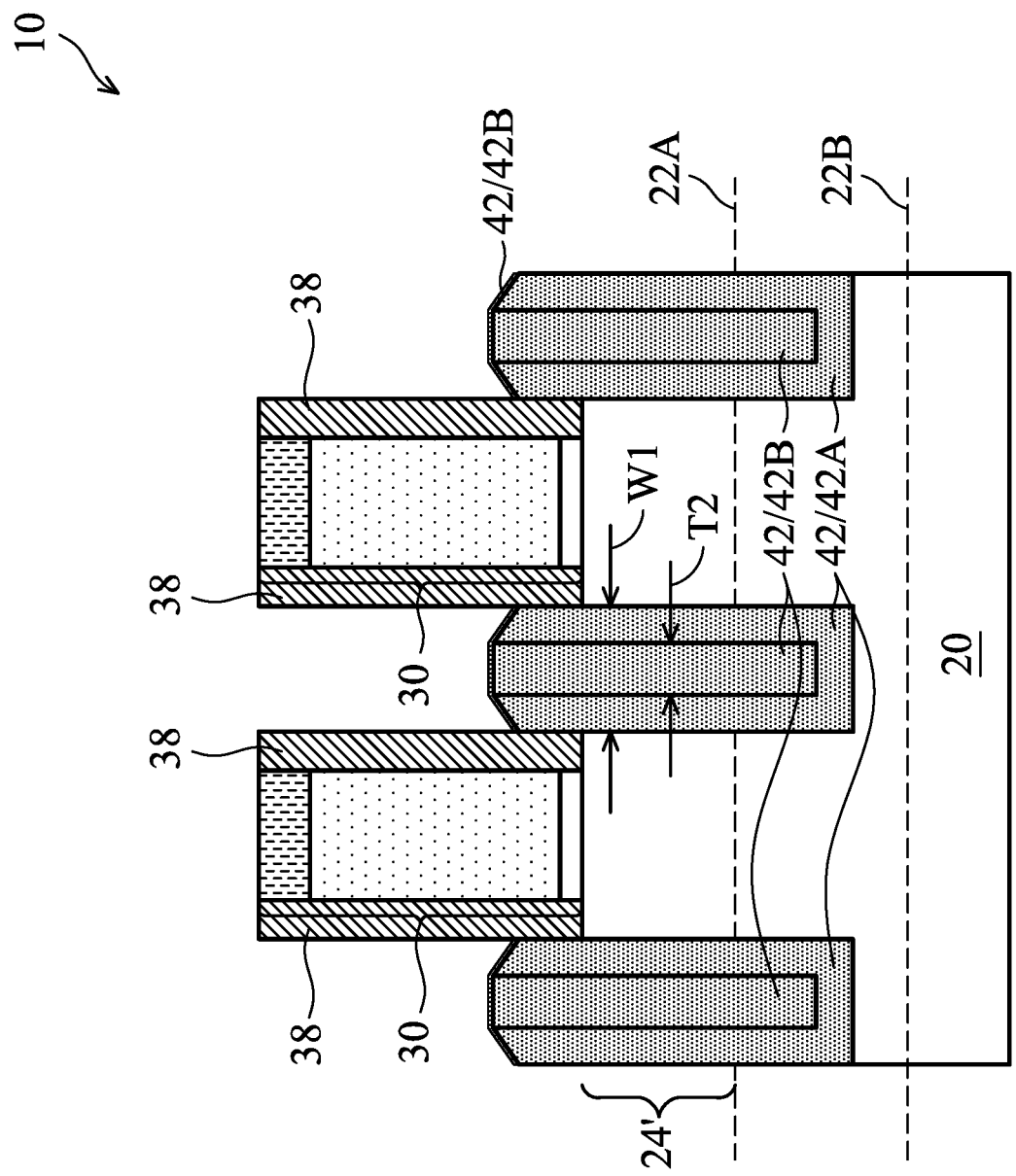

FIGS. 5 through 7 illustrate the epitaxy processes for forming epitaxy layers 42A, 42B, and 42C, which are collectively or individually referred to as epitaxy layers (or regions) 42. Throughout the description, epitaxy layers 42 are also referred to as source/drain regions 42. In accordance with some embodiments of the present disclosure, the Fin-FET to be formed by the illustrated processes is an n-type FinFET, and hence epitaxy layers 42 are of n-type. The formation methods epitaxy layers 42A, 42B, and 42C may include Chemical Vapor Deposition (CVD), Plasma-Enhanced Chemical Vapor Deposition (PECVD), or the like, and the reaction is performed in a process chamber that is configured to be vacuumed. The process gases used for epitaxy may include a silicon-containing gas such as dichlorosilane (DCS, $H_2SiCl_2$) and/or monochlorosilane (MCS, $SiH_3Cl$). The process gases may further include a phosphorous-containing gas such as phosphine ($PH_3$) or diphosphane ($P_2H_4$). An etching gas such as HCl may be included in the process gases so that the epitaxy occurs selectively on semiconductor regions, and not on dielectric regions. The phosphorous-containing gas results in the in-situ doping of epitaxy layers 42 with phosphorous, and the resulting epitaxy regions 42 may be phosphorous-doped silicon (SiP, also referred to as silicon phosphorus) regions. In accordance with some embodiments, when a carbon-containing process gas such as $Si_xH_y(CH_3)_z$ (with x, y, z being integers) is added, the resulting epitaxy layers 42 may be silicon carbon phosphorous (SiCP) regions. In subsequent description, both SiP and SiCP may be referred to as silicon phosphorous (SiP), which may or may not include carbon. In addition, silane ($SiH_4$) is included in the process gases. In the epitaxy, plasma is turned on.

In accordance with some embodiments of the present disclosure, silane has a low percentage in the process gases. For example, the ratio FR(silane)/(FR(DCS)+FR(silane)) is low, wherein FR(silane) represents the flow rate of silane, and FR(DCS) represents the flow rate of DCS. In accordance with some embodiments of the present disclosure, ratio FR(silane)/(FR(DCS)+FR(silane)) is in the range between about 0.5 percent and about 5 percent, and may be in the range between about 1 percent and about 3 percent.

The following reaction formulas show the reactions for forming SiP when DCS and silane are used as process gases:

$$PH_3 \rightarrow PH + H_2 \quad Ea = 3.8 \text{ eV} \quad \text{(Eq. 1)}$$

$$PH_3 \rightarrow PH_2 + H \quad Ea = 3.7 \text{ eV} \quad \text{(Eq. 2)}$$

$$SiH_4 \rightarrow SiH_2 + H_2 \quad Ea = 2.8 \text{ eV} \quad \text{(Eq. 3)}$$

$$PH_3 + SiH_2 \rightarrow SiPH_5 \quad Ea = 1.39 \text{ eV} \quad \text{(Eq. 4)}$$

The bond energies Ea are also illustrated in the reaction formulas as presented in Equations 1 through 4. The reactions illustrate that $PH_3$ may be deionized under plasma, and is used in the reaction chamber for the epitaxy. The reaction formulas also indicate that the bond energy for generating $SiH_2$ from silane (Equation 3) is low, and is lower than the bond energies for ionizing $PH_3$ (Equations 1 and 2). Also, the bond energy for $PH_3$ to directly react with $SiH_2$ (Equation 4) is also low, and is lower than the bond energies for ionizing $PH_3$ (Equations 1 and 2). Accordingly, when silane is added into the process gases, it is easy for silane to react directly with $PH_3$ to form bonds than ionizing $PH_3$.

It is appreciated that it is not easy for using $PH_3$ to dope the deposited silicon (deposited using DCS) due to the high ionizing energy for ionizing $PH_3$ (Equations 1 and 2). Accordingly, silane is used to form Si—P bonds first, and phosphorous is deposited in the form of Si—P. This prevents phosphorus from being evacuated from the reaction chamber. Also, the adsorption energy of Si—P bonds is greater than 4.5 eV, which is much higher than the adsorption energy 0.8 eV of $PH_3$, the adsorption energy 2.6 eV of $PH_2$, and the adsorption energy 3.4 eV of $P_2$. This indicates that the Si—P is much more stable than $PH_3$, $PH_2$, $P_2$, and Si—P can be more reliably doped in epitaxy layers 42 than other forms of phosphorus-containing material such as $PH_3$, $PH_2$, and $P_2$.

Experimental results have indicated that adding a small percentage of silane into another silicon-containing process gas has a significant effect in the increase of the atomic percentage of phosphorous (referred as phosphorous atomic percentage hereinafter) in silicon epitaxy layers. For example, by making ratio FR(silane)/(FR(DCS)+FR(silane)) to be about 1 percent, the phosphorous atomic percentage in the resulting SiP may be about 0.5 percent. When ratio FR(silane)/(FR(DCS)+FR(silane)) is increased to be in the range between about 3 percent and about 5 percent, the phosphorous atomic percentage in the resulting SiP may be higher than about 5 percent, higher than about 6 percent, or higher than about 7 percent, and may be in the range between about 5 percent and about 11 percent, between about 6 and about 11 percent, or between about 7 and about 11 percent. In addition, when keeping other process conditions such as the chamber pressure, the flow rate of the DCS and $PH_3$, etc. unchanged, increasing the flow rate of silane has a clear effect in the phosphorous atomic percentage in the resulting epitaxy SiP layer.

In accordance with some embodiments of the present disclosure, experiments are performed to establish a correlation between the amount of silane used in the deposition process and the phosphorous atomic percentage in the resulting SiP. The "amount" of silane may be indicated by the flow rate of silane, the partial pressure of silane, and/or the ratio FR(silane)/(FR(DCS)+FR(silane))). In the experiments, a first plurality of sample wafers are provided so that SiP epitaxy layers may be formed thereon. In the experiments, the process conditions other than the amount of silane are kept the same from wafer to wafer, while the amount of silane is changed from wafer to wafer. The phosphorous atomic percentages in the resulting SiP layers formed on the first plurality of sample wafers are measured to determine the correlation. The experiments may also include providing a second plurality of sample wafers, and forming SiP layers on the second plurality of sample wafers. The process conditions other than the amount of silane for forming SiP layers on the second plurality of sample wafers are different from what are used for forming SiP layers on the first plurality of sample wafers. Similarly, in the experiments, the process conditions other than the amount of silane are kept the same from wafer to wafer, while the amount of silane is changed from wafer to wafer. The phosphorous atomic percentages in the resulting SiP layers formed on the second plurality of sample wafers are measured to determine the correlation. The results obtained from the first plurality of sample wafers and the second plurality of sample wafers provide information how the correlation will be affected if the process conditions other than the amount of silane are changed.

The found correlation between the amount of silane and the phosphorous atomic percentage may be used to determine the process conditions for forming SiP layers having very high phosphorous atomic percentages, and may be used to find the process conditions for forming a SiP layer with certain desirable phosphorous atomic percentages, which may range between about 0.5 percent to about 11 percent, for example.

With the correlation between the amount of silane and the resulting phosphorous atomic percentages being found from the experiments, the process conditions for layers 42A, 42B, and 42C (FIG. 7) may be selected so that each of the layers 42A, 42B, and 42C has a desirable phosphorous atomic percentage. For example, when layers 42A, 42B, and 42C are intended to have different phosphorous atomic percentage, the silane amount (such as the flow rate of silane) in the deposition processes may be adjusted to adjust the phosphorous atomic percentages, while other process conditions may remain unchanged. This simplifies the formation process and improves throughput.

Referring to FIG. 5, epitaxy layer 42A is epitaxially grown from trenches 40. The respective process is illustrated as process 210 in the process flow shown in FIG. 11. In accordance with some embodiments of the present disclosure, the growth is conformal or substantially conformal, and the growth occurs on the exposed sidewall surfaces of semiconductor fin and the top surfaces of the bulk substrate 20, wherein the top surfaces of the bulk substrate 20 are at the bottoms of trenches 40. In accordance with some embodiments of the present disclosure, the process gases include DCS having a flow rate in the range between about 700 sccm and about 1,000 sccm. In accordance with some embodiments of the present disclosure, no silane is added. In accordance with other embodiments, a small amount of silane is added, with the ratio FR(silane)/(FR(DCS)+FR(silane)) being in the range between about 0.5% and about 10%. For example, silane may be added with a flow rate lower than about 5 sccm or lower than about 2 sccm. The process gases may also include $PH_3$ with a flow rate in the range between about 50 sccm and about 150 sccm. The resulting epitaxy layer 42A may include SiP having a highest or average phosphorous atomic percentage AP(42A) in the range between about 0.5 percent and about 2.0 percent. Epitaxy layer 42A has thickness T1, which is related to the width W1 of trench 40. For example, ratio T1/W1 may be in the range between about ⅛ and about ⅜. In the epitaxy, the temperature of wafer 10 may be in the range between about 620° C. and about 680° C.

FIG. 6 illustrates the formation of epitaxy layer 42B. The respective process is illustrated as process 212 in the process flow shown in FIG. 11. In accordance with some embodiments of the present disclosure, epitaxy layer 42B is in-situ formed in the same process chamber for forming epitaxy layer 42A, with no vacuum break therebetween. Epitaxy layer 42B may fully fill the remaining portions of trenches 40 in accordance with some embodiments of the present disclosure. Thickness T2 of epitaxy layer 42B may be in the range between about ⅛ and about ⅜ of width W1 of trenches 40. In accordance with some embodiments of the present disclosure, the process gases include DCS having a flow rate in the range between about 700 sccm and about 1,000 sccm, and silane having a flow rate in the range between about 10 sccm and about 100 sccm. The ratio FR(silane)/(FR(DCS)+FR(silane)) may also be in the range between about 0.5% and about 10%. The process gases may also include $PH_3$ with a flow rate in the range between about 150 sccm and about 300 sccm. The resulting SiP layer 42B has a phosphorus atomic percentage AP(42B) higher than about 5 percent, higher than about 6 percent, or higher than about 7 percent. The highest or average phosphorous atomic percentage AP(42B) in layer 42B may also be in the range between about 5 and about 11 percent, between about 6 and about 11 percent, between about 7 and about 11 percent, or close to about 11 percent. Furthermore, ratio AP(42B)/AP(42A) is greater than 1.0, and may be in the range between about 2 and about 10. The process gases may also include an etching gas such as HCl.

In accordance with some embodiments of the present disclosure, when the process is changed from the formation of epitaxy layer 42A to the formation of epitaxy layer 42B, the flow rate of silane is increased, while other process conditions such as the flow rates of other process gases (including DCS, $PH_3$, and HCl), the wafer temperature, etc. remain unchanged or substantially unchanged. For example, assuming the flow rate of silane in the formation of epitaxy layer 42A is FSA (which may be zero sccm or a small value smaller than about 2 sccm), and the flow rate of silane in the formation of epitaxy layer 42B is FSB, the ratio of FSA/FSB is smaller than about 0.1, and may be in the range between about 0 and about 0.1. When the flow rate of silane is higher enough, the increase in phosphorous atomic percentage may start to saturate when the phosphorous atomic percentage reaches about 10 percent, and the further increase in the flow rate of silane has little effect in the increase of phosphorous atomic percentage. Epitaxy layer 42B may have a thin layer on the top surface of epitaxy layer 42A.

Figure 7A:
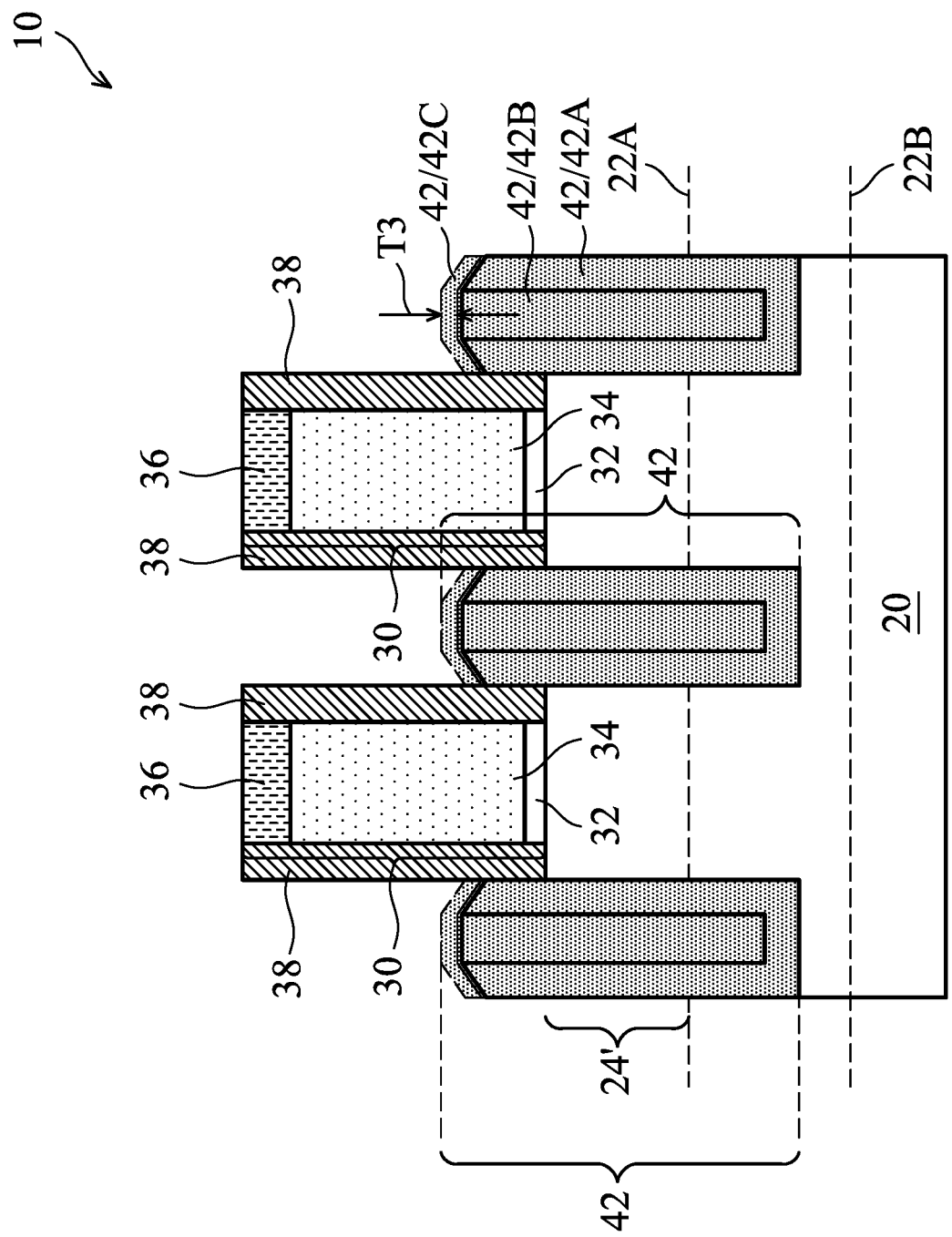

FIG. 7A illustrates the formation of epitaxy layer 42C in accordance with some embodiments of the present disclosure. The respective process is illustrated as process 214 in the process flow shown in FIG. 11. In accordance with alternative embodiments, epitaxy layer 42C is not formed. Accordingly, epitaxy layer 42C is illustrated using dashed lines to indicate it may or may not be formed. Thickness T3 of epitaxy layer 42C may be in the range between about ⅛ to about ¼ of width W1 of trenches 40. Epitaxy layer 42C has a phosphorous atomic percentage AP(42C) lower than the phosphorous atomic percentage AP(42B) of epitaxy layer 42B. For example, epitaxy layer 42C may include SiP having a highest or average phosphorous atomic percentage AP(42C) in the range between about 0.5 percent and about 2.0 percent. Since wafer 10 may experience a plurality of clean processes, by forming a top epitaxy layer 42C with a lower phosphorus atomic percent, the loss of epitaxy layer 42 in the cleaning processes may be reduced since the SiP layers with high phosphorus atomic percentages are more prone to the loss. Phosphorous atomic percentage AP(42C) may also be equal to or lower than phosphorous atomic percentage AP(42A).

In accordance with some embodiments of the present disclosure, when the process is changed from the formation of epitaxy layer 42B to the formation of epitaxy layer 42C, the flow rate of silane is reduced, while other process conditions such as the flow rate of other process gases (including DCS, $PH_3$, and HCl), the wafer temperature, etc. remain unchanged. For example, assuming the flow rate of silane in the formation of epitaxy layer 42B is FSB, and the flow rate of silane in the formation of epitaxy layer 42C is FSC, the ratio of FSC/FSB is smaller than 1.0, and may be in the range between about 0 and about 0.1. In accordance with some embodiments of the present disclosure, no silane is added. In accordance with other embodiments, a small amount of silane is added. For example, silane may be added with a flow rate lower than about 5 sccm or lower than about 2 sccm.

After the formation of epitaxy regions 42, a source/drain implantation may be performed to further increase the n-type dopant concentration/percentage of the n-type dopants. In accordance with some embodiments of the present disclosure, phosphorous is implanted. In the implant, the dopant, such as phosphorous and/or arsenic, is implanted, with the dopant source includes $PH_3$, $PF_3$, $PF_5$, $AsH_3$, $AsF_3$, and/or $AsF_5$. The implanted dopants may reach the bottom of epitaxy regions 42. In accordance with some embodiments of the present disclosure, the implantation step is skipped.

Figure 7B:
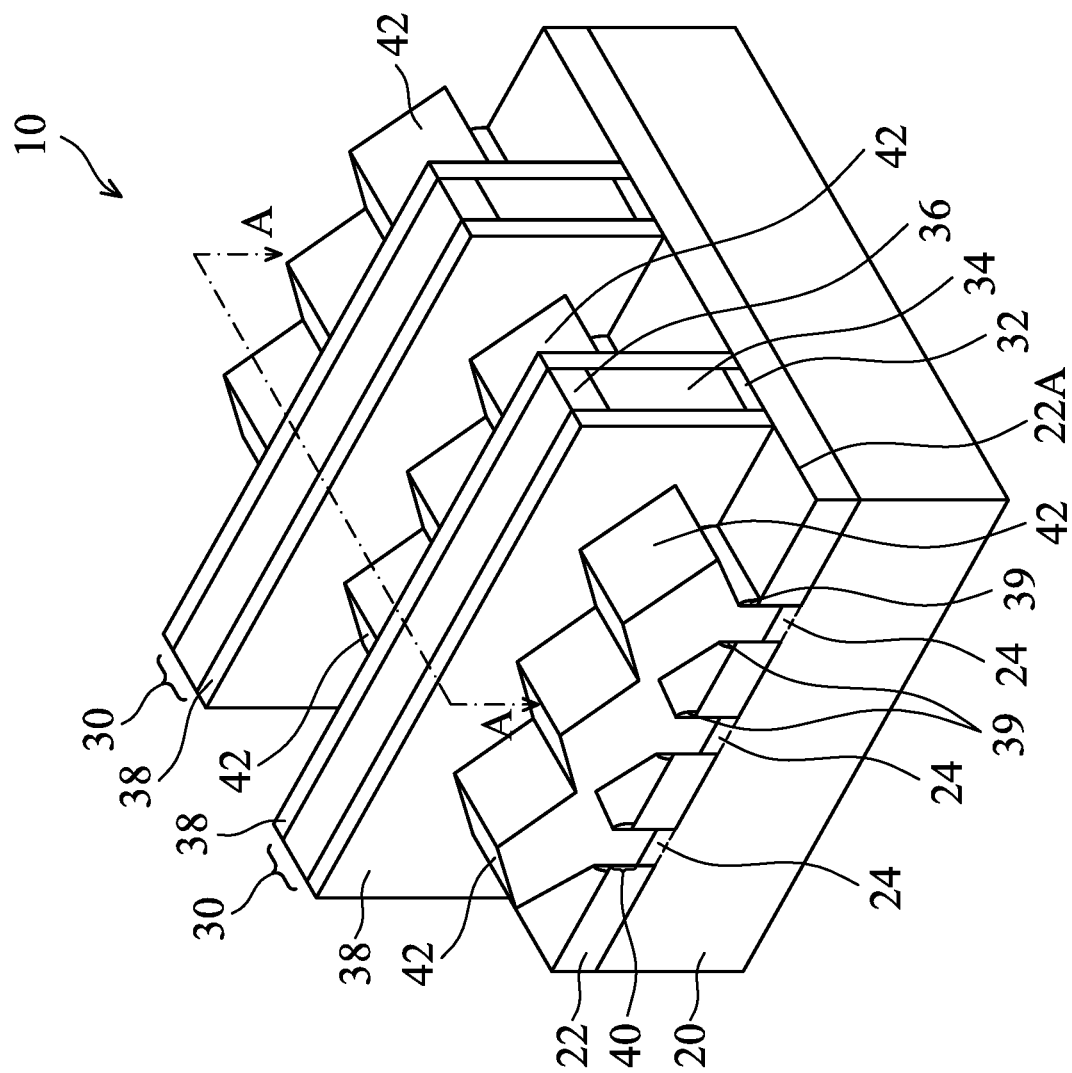

FIG. 7B illustrates a perspective view of the structure shown in FIG. 7A, wherein the structure shown in FIG. 7A is obtained from the vertical plane containing arrows A-A in FIG. 7B. As shown in FIG. 7B, when fin spacers 39 exist, the growth of epitaxy regions 42 is limited by fin spacers 39, until the top surfaces of epitaxy regions 42 are higher than the top ends of fin spacers 39, at which time epitaxy regions 42 start to expand laterally at the same time they are grown upwardly. The neighboring epitaxy regions 42 may be grown together to form a large epitaxy region, or may be separated from each other. In accordance with some embodiments of the present disclosure, fin spacers 39 are not formed. Accordingly, epitaxy regions 42 start to expand laterally when the top surfaces of epitaxy regions 42 are higher than the top surfaces 22A of STI regions 22.

Figure 8:
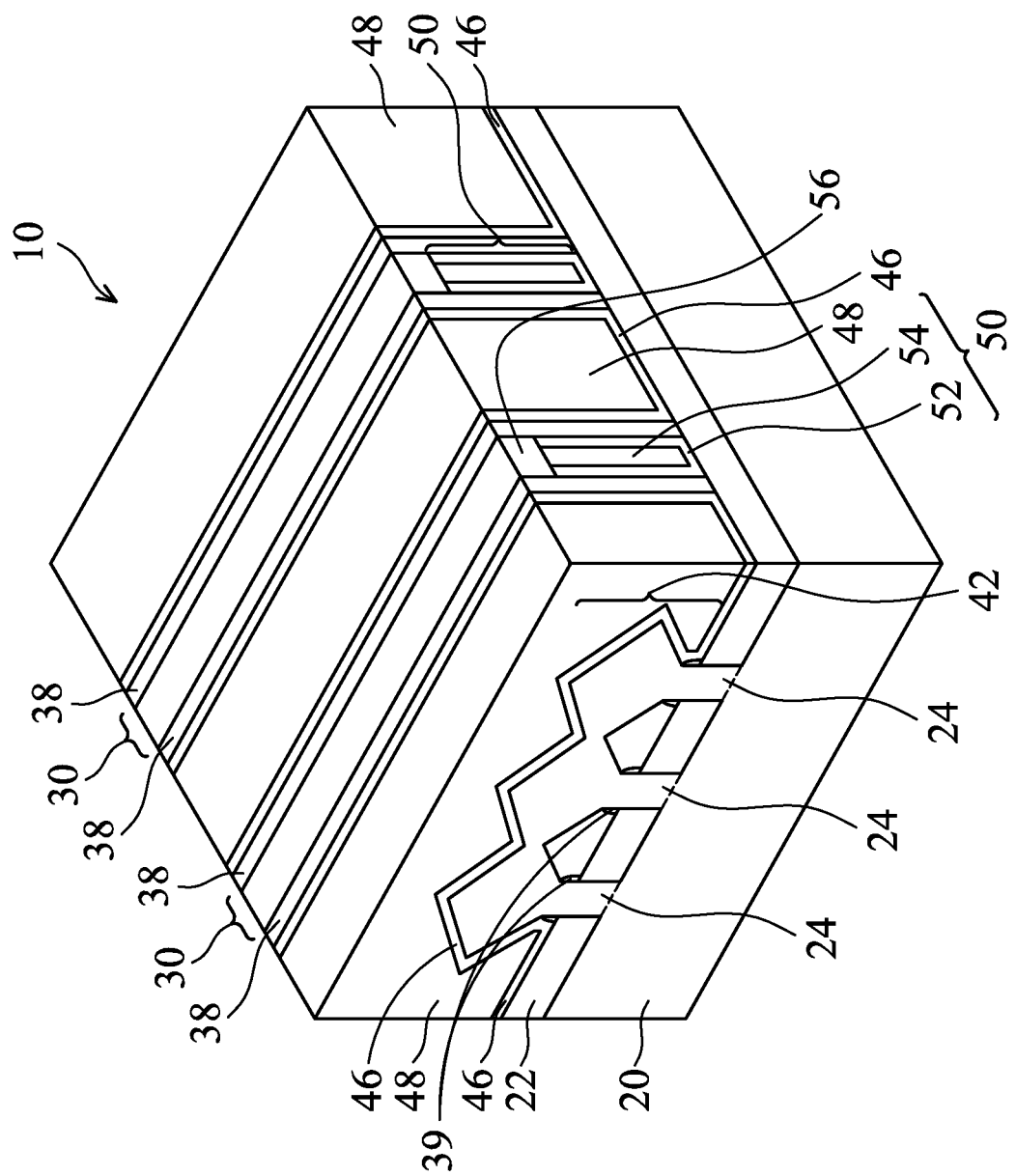

FIG. 8 illustrates a perspective view of the structure after the formation of Contact Etch Stop Layer (CESL) 46 and Inter-Layer Dielectric (ILD) 48. The respective process is illustrated as process 216 in the process flow shown in FIG. 11. CESL 46 may be formed of silicon nitride, silicon carbo-nitride, or the like. In accordance with some embodiments of the present disclosure, CESL 46 is formed using a conformal deposition method such as Atomic Layer Deposition (ALD) or CVD. ILD 48 may include a dielectric material formed using, for example, Flowable Chemical Vapor Deposition (FCVD), spin-on coating, CVD, or another deposition method. ILD 48 may also be formed of an oxygen-containing dielectric material, which may be a silicon-oxide based material such as Tetra Ethyl Ortho Silicate (TEOS) oxide, a PECVD oxide ($SiO_2$), Phospho-Silicate Glass (PSG), Boro-Silicate Glass (BSG), Boron-Doped Phospho-Silicate Glass (BPSG), or the like. A planarization process such as a Chemical Mechanical Polish (CMP) process or a mechanical grinding process may be performed to level the top surfaces of ILD 48, dummy gate stacks 30, and gate spacers 38 with each other.

FIG. 8 also illustrates the formation of replacement gates 50. The respective process is illustrated as process 218 in the process flow shown in FIG. 11. The formation process includes removing the remaining portions of dummy gate stack 30 (FIGS. 7A and 7B) to form trenches, and forming replacement gates 50 in the resulting trenches. Replacement gates 50 include gate dielectrics 52 and metal gate electrodes 54. In accordance with some embodiments of the present disclosure, each of gate dielectrics 52 includes an Interfacial Layer (IL, not shown separately) as its lower part. The IL is formed on the exposed surfaces of protruding fins 24'. The IL may include an oxide layer such as a silicon oxide layer, which is formed through the thermal oxidation of protruding fins 24' (not shown in FIG. 8), a chemical oxidation process, or a deposition process. Gate dielectric layer 52 may also include a high-k dielectric layer (not shown separately) formed over The IL. The high-k dielectric layer may include a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0. The high-k dielectric layer is overlying, and may contact, The IL. The high-k dielectric layer may be formed as a conformal layer, and extends on the sidewalls of protruding fins 24' and the sidewalls of gate spacers 38. In accordance with some embodiments of the present disclosure, the high-k dielectric layer is formed using ALD or CVD.

Gate electrode 54 may include a diffusion barrier layer and one (or more) work-function layer over the diffusion barrier layer. The diffusion barrier layer may be formed of titanium nitride (TiN), which may (or may not) be doped with silicon. The work-function layer determines the work function of the gate, and includes at least one layer, or a plurality of layers formed of different materials. The material of the work-function layer may include a TaN layer and a titanium aluminum (TiAl) layer over the TaN layer, for example. After the deposition of the work-function layer(s), another barrier layer, which may be another TiN layer, is formed. A filling metal such as tungsten or cobalt may fill the remaining trenches left by the removed dummy gates. A planarization process may then be performed to remove excess portions of the diffusion barrier layer, the work function layer, the filling metal, etc. to form gate electrodes 54.

Hard masks 56 are formed over gate stacks 50 and between gate spacers 38. Hard mask 56 may be formed of silicon nitride, silicon oxy-carbo-nitride, or the like. The formation of hard masks 56 may include recessing the replacement gate stacks 50, filling the resulting recesses with a dielectric material, and preforming a planarization process to remove excesses portions of the dielectric material.

Figure 9A:
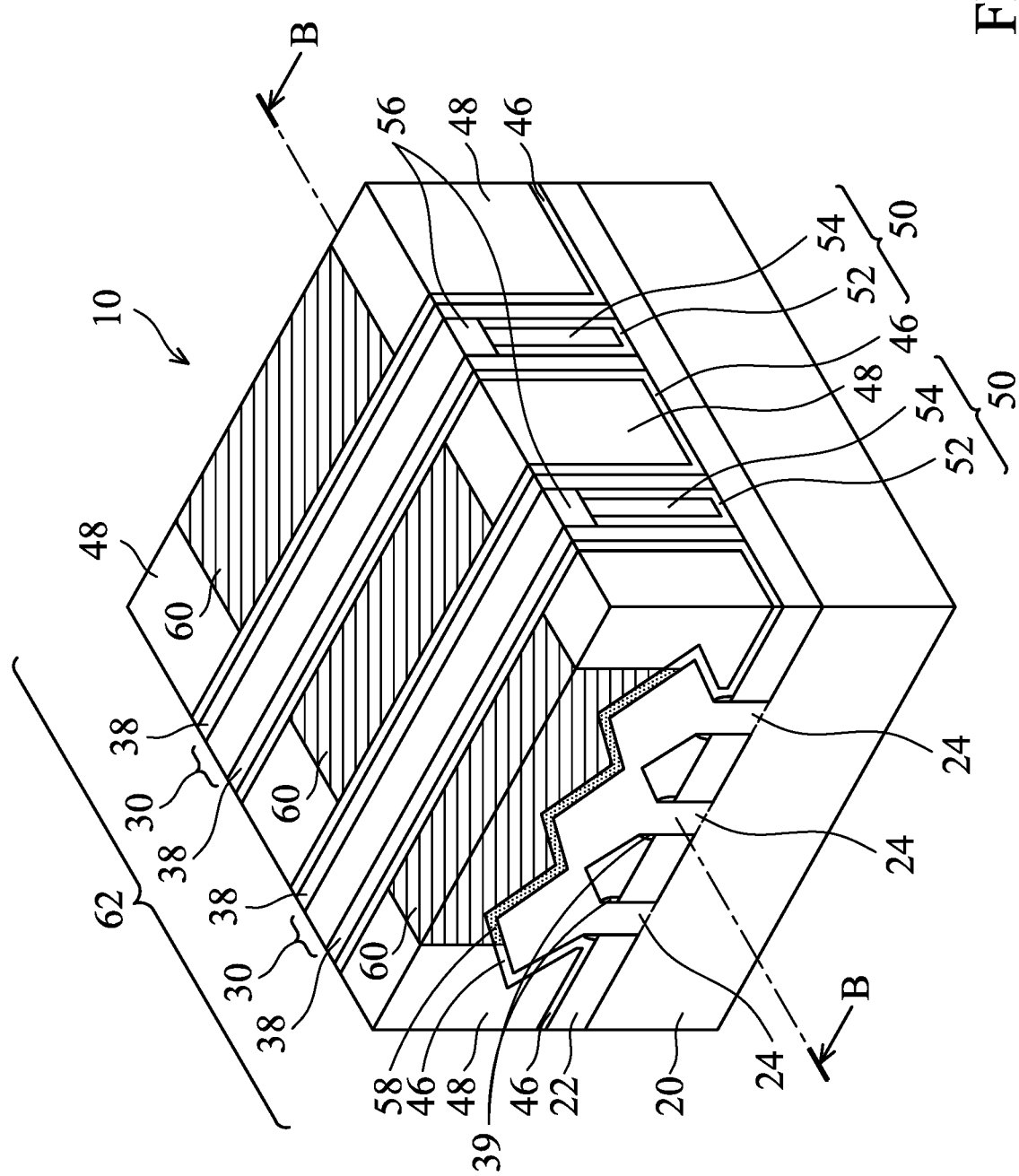

Referring to FIG. 9A, some portions of ILD 48 and CESL 46 are removed to form contact openings, followed by siliciding the exposed portions of source/drain regions 42 to form source/drain silicide regions 58. A conductive material such as tungsten is filled into the contact openings to form source/drain contact plugs 60. The respective process is illustrated as process 220 in the process flow shown in FIG. 11. N-type FinFET 62 and the corresponding source/drain contact plugs are thus formed. In accordance with some embodiments of the present disclosure, as shown in FIG. 9A, source/drain regions formed based on different fins are merged. In accordance with other embodiments of the present disclosure, the source/drain regions formed based on different fins remain separated from each other.

Figure 9B:
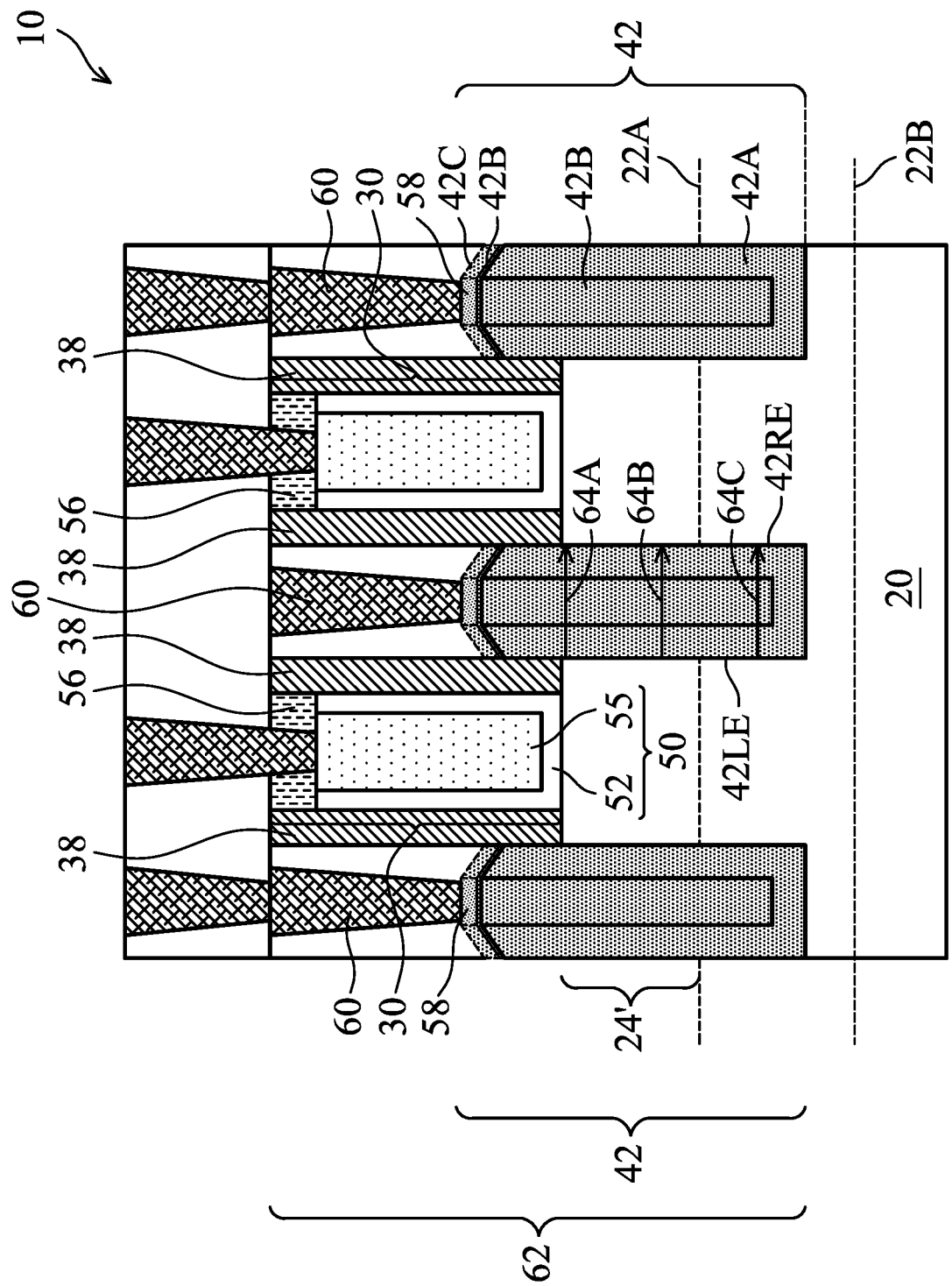

FIG. 9B illustrates a cross-sectional view of the structure shown in FIG. 9A, wherein the structure shown in FIG. 9B is obtained from the vertical plane containing line B-B in FIG. 9A. In accordance with some embodiments of the present disclosure, silicide regions 58 penetrate through epitaxy layers 42C (if formed) to contact epitaxy layers 42B, which have a high dopant concentration/percentage. Accordingly, source/drain currents can flow between source/drain contacts 60 and the high-concentration source/drain layers 42B, without going through the low-concentration source/drain layers 42C. The source/drain resistance is thus reduced, and the saturation currents of FinFET 62 are increased. On the other hand, the low-concentration epitaxy regions 42A are formed to prevent the adverse effect to the short channel effect of FinFET 62, and the low-concentration epitaxy regions 42C are formed to reduce the loss of epitaxy regions 42 in cleaning processes. In accordance with some embodiments of the present disclosure, the gate lengths of short-channel FinFETs are smaller than about 17 nm. The gate length of mid-channel FinFET may be in the range between about 38 nm and about 50 nm. The gate length of long-channel FinFET may be in the range between about 90 nm and about 260 nm.

Figure 10A:
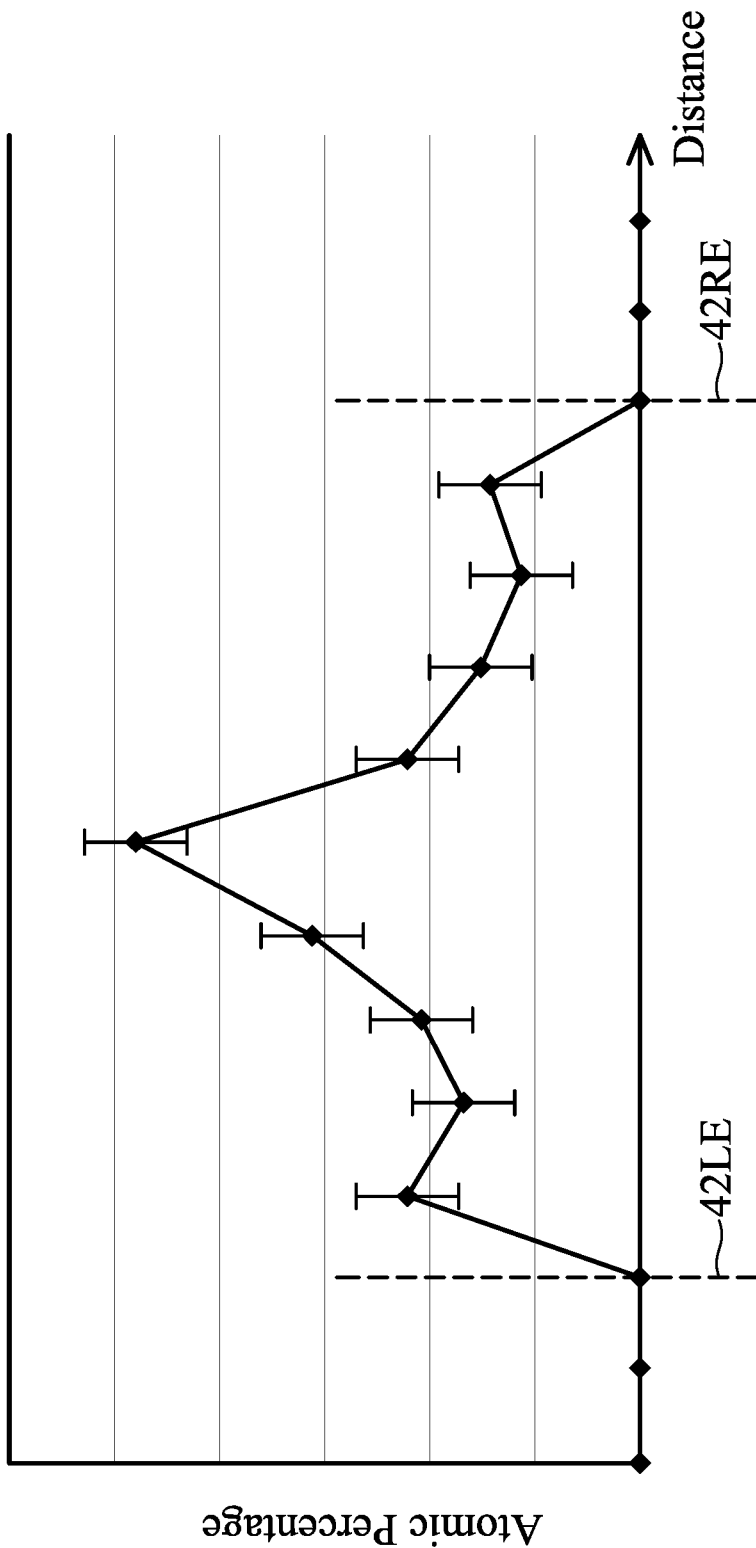
FIGS. 10A, 10B, and 10C illustrate the dopant profiles obtained at different heights of an epitaxy source/drain region of a FinFET in accordance with some embodiments.
Figure 10B:
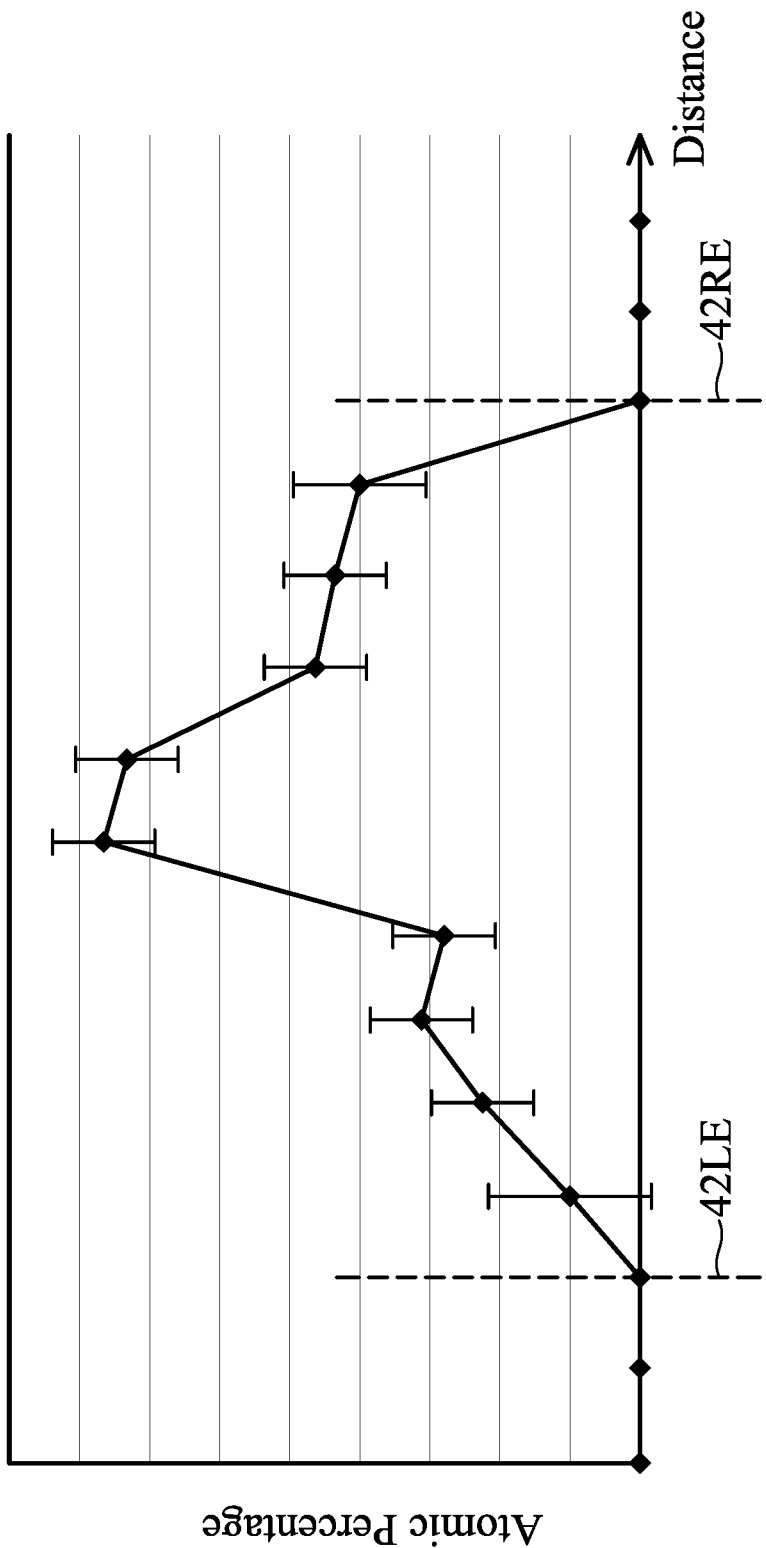
Figure 10C:
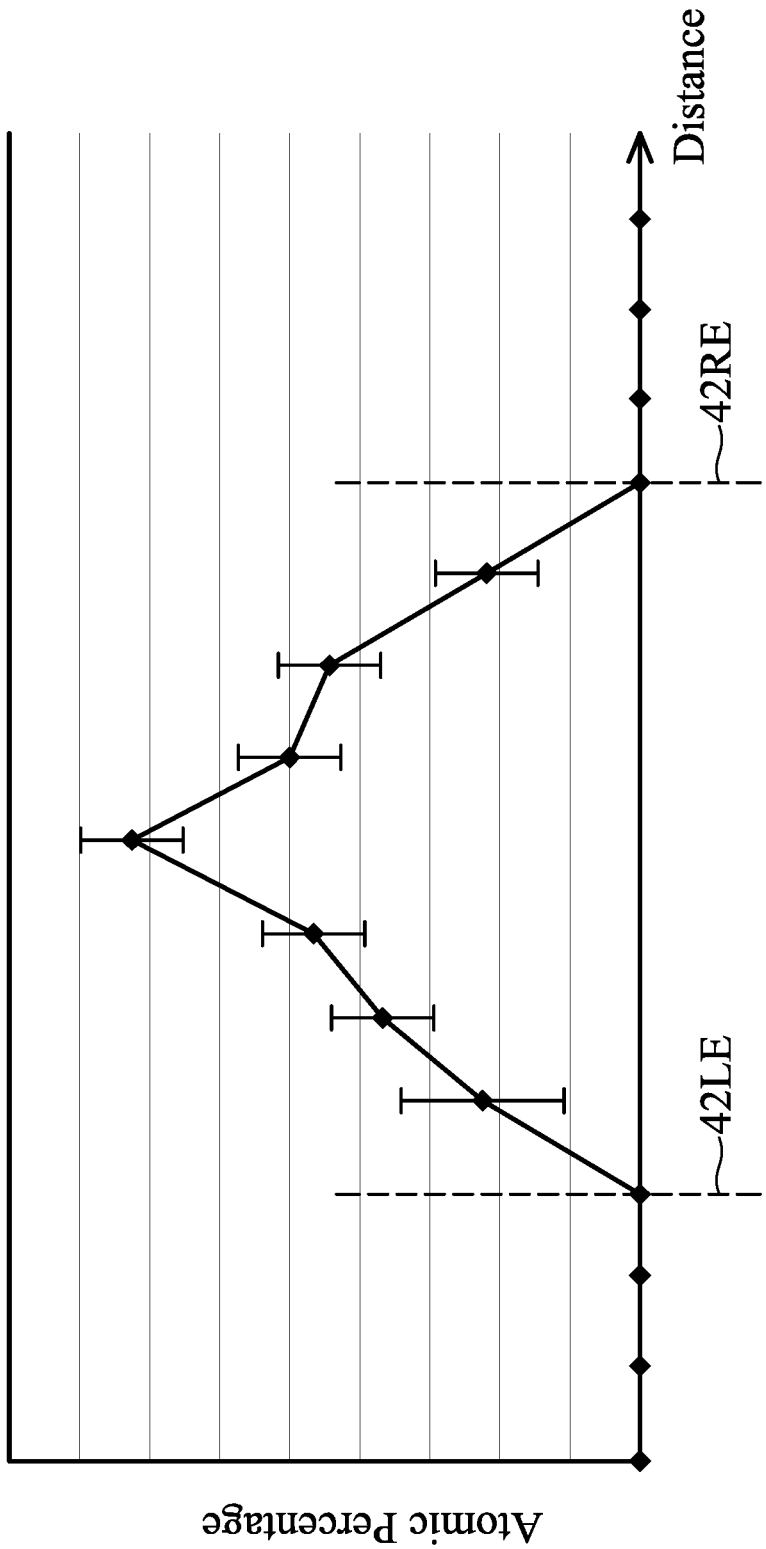

FIGS. 10A, 10B, and 10C illustrate the phosphorous atomic percentage profiles obtained from a source/drain region 42. FIG. 10A illustrates the phosphorous atomic percentage obtained from a level close to the top-surface-level of fin 24', and the corresponding level is represented by arrow 64A in FIG. 9B. FIG. 10C illustrates the phosphorous atomic percentage obtained from the position within 15 nm from the bottom of epitaxy regions 42, and the corresponding level is represented by arrow 64C in FIG. 9B. FIG. 10B illustrates the phosphorous atomic percentage obtained from a level in the middle of levels 64A and 64C, and the corresponding level is represented by arrow 64B in FIG. 9B. In FIGS. 10A, 10B, and 10C, the X-axes represent the distance from the left edge 42LE (FIG. 9B) of epitaxy region 42. The left edge 42LE and right edge 42RE of epitaxy region 42 are marked in FIG. 9B and FIGS. 10A, 10B, and 10C. The Y-axes represent the phosphorus atomic percentages. FIGS. 10A, 10B, and 10C thus illustrate the phosphorous atomic percentages as functions of distances from left edges 42LE. The lowest phosphorous atomic percentage shown in FIGS. 10A, 10B, and 10C are in the range between about 0.5 percent and about 2.0 percent, and the highest percentage in FIGS. 10A, 10B, and 10C are between about 8 percent and about 11 or 13 percent. FIGS. 10A, 10B, and 10C all illustrate that a high-phosphorous-percentage region is formed in the middle of the source/drain regions, and the high-phosphorous-percentage region extend to close to the top and close to the bottom of source/drain regions 42. The low-phosphorous-percentage regions are closer to the channels. The high-phosphorous-percentage region includes layer 42B (FIG. 9B), and the low-phosphorous-percentage region include layer 42A. In the direction from the left edge 42LE to the right edge 42RE of source/drain regions 42 (FIG. 9B), the phosphorous atomic percentages gradually increase to a maximum value, wherein the maximum value is close to the middle line between left edge 42LE and right edge 42RE, and then gradually decrease.

The embodiments of the present disclosure have some advantageous features. By incorporating silane in the process gases (in addition to another silicon-containing process(es)) for epitaxially growing sourced/drain regions, the atomic percentage of phosphorous in the epitaxy regions is increased. For example, in conventional processes, silane was not incorporated, and DCS and $PH_3$ are used, the phosphorous atomic percentage may reach about 3 percent to about 5 percent, and cannot be increased higher. It is noted that increasing the phosphorous atomic percentage by increasing the flow rate of $PH_3$ is not feasible since too much $PH_3$ causes the growth of SiP on dielectric even if HCl is used. In accordance with some embodiments of the present disclosure in which silane is incorporated, however, although the amount of silane is low, much more phosphorous can be left in the epitaxy regions due to the bonding of phosphorous to silicon. Accordingly, the phosphorous atomic percentage can achieve very high value without the need of resorting to the problematic increase in the flow rate of $PH_3$. In addition, since the phosphorous atomic percentage is correlated to the amount (such as the flow rate) of silane, and is increased when the flow rate of silane is increased, the phosphorous atomic percentage can be easily adjusted to desirable values by simply adjusting the flow rates of silane without the need to adjusting other process parameters.

In accordance with some embodiments of the present disclosure, a method includes recessing a semiconductor fin to form a recess, wherein the semiconductor fin protrudes higher than isolation regions on opposite sides of the semiconductor fin, and performing a first epitaxy to grow a first epitaxy layer extending into the recess. The first epitaxy is performed using a first process gas comprising a silicon-containing gas, silane, and a phosphorous-containing gas. The first epitaxy layer has a first phosphorous atomic percentage. The method further includes performing a second epitaxy to grow a second epitaxy layer extending into the recess and over the first epitaxy layer. The second epitaxy is performed using a second process gas comprising the silicon-containing gas, silane, and the phosphorous-containing gas. The second epitaxy layer has a second phosphorous atomic percentage higher than the first phosphorous atomic percentage. In the first epitaxy, the phosphorous-containing gas has a first flow rate, and in the second epitaxy, the phosphorous-containing gas has a second flow rate equal to the first flow rate. The second phosphorous atomic percentage is higher than about two times the first phosphorous atomic percentage. In an embodiment, the method further includes performing a third epitaxy to grow a third epitaxy layer over the second epitaxy layer, wherein the third epitaxy is performed using a third process gas comprising the silicon-containing gas, silane, and the phosphorous-containing gas, and the third epitaxy layer has a third phosphorous atomic percentage lower than the second phosphorous atomic percentage. The first epitaxy layer and the second epitaxy layer in combination form at least parts of a source/drain region of an n-type FinFET, and the source/drain region is between a first gate stack and a second gate stack, and in a direction pointing from a first sidewall of the source/drain region close to the first gate stack to a second sidewall of the source/drain region close to the second gate stack, a phosphorous atomic percentage gradually increases to a highest level, and gradually decreases from the highest level. In the first epitaxy, silane has a first flow rate, and in the second epitaxy, silane has a second flow rate higher than the first flow rate. In the first epitaxy, the silicon-containing gas has a third flow rate, and in the second epitaxy, the silicon-containing gas has a fourth flow rate equal to the first flow rate. The first epitaxy and the second epitaxy are in-situ performed in a same process chamber, and a flow rate of silane is increased from the first epitaxy to the second epitaxy, and wherein flow rates of the silicon-containing gas and the phosphorous-containing gas are kept un-changed. The silicon-containing gas comprises DCS, and the phosphorous-containing gas comprises phosphine ($PH_3$).

In accordance with some embodiments of the present disclosure, a method includes recessing a semiconductor fin to form a recess, wherein the semiconductor fin protrudes higher than isolation regions, and the isolation regions are on opposite sides of the semiconductor fin; performing a first epitaxy to grow a first epitaxy layer extending into the recess, wherein the first epitaxy layer comprises silicon phosphorous, and the first epitaxy layer has a first phosphorous atomic percentage; and performing a second epitaxy to grow a second epitaxy layer extending into the recess and over the first epitaxy layer, wherein the second epitaxy layer comprises silicon phosphorous, and the second epitaxy layer has a second phosphorous atomic percentage higher than about 6 percent, and the second epitaxy layer is selectively grown on the first epitaxy layer without grown from the isolation regions. The first epitaxy and the second epitaxy are performed using same types of process gases comprising a phosphorous-containing gas, and from the first epitaxy to the second epitaxy, the phosphorous-containing gas have substantially a same flow rate. The first epitaxy and the second epitaxy are performed using DCS, silane, phosphine (PH$_3$), and HCl. The first epitaxy and the second epitaxy are performed with substantially a same flow rate of DCS, and a substantially same flow rate of PH$_3$. The first epitaxy is performed with a first flow rate of silane, and the second epitaxy is performed with a second flow rate of silane, and the second flow rate is higher than the first flow rate. in both the first epitaxy and the second epitaxy, a ratio of a flow rate of silane to a total flow rate of DCS and silane is lower than about 5 percent.

In accordance with some embodiments of the present disclosure, a device includes a semiconductor substrate; isolation regions extending into the semiconductor substrate; a semiconductor fin between opposite portions of the isolation regions, wherein the semiconductor fin protrudes higher than top surfaces of the isolation regions; a first gate stack and a second gate stack on top surfaces and sidewalls of a first portion and a second portion of the semiconductor fin, respectively; and a source/drain region extending into a third portion of the semiconductor fin, wherein the third portion is between the first portion and the second portion, and the source/drain region comprises: a first silicon phosphorous layer having a first phosphorous atomic percentage; and a second silicon phosphorous layer overlapping a bottom portion of the first silicon phosphorous layer, with the first silicon phosphorous layer comprising sidewall portions on opposite sides of the second silicon phosphorous layer, wherein the second silicon phosphorous layer has a second phosphorous atomic percentage higher than about 6 percent, and the second phosphorous atomic percentage is higher than the first phosphorous atomic percentage. In an embodiment, the device further includes a third silicon phosphorous layer overlapping the first silicon phosphorous layer and the second silicon phosphorous layer, wherein the third silicon phosphorous layer has a third phosphorous atomic percentage lower than the second phosphorous atomic percentage. In an embodiment, the first silicon phosphorous layer and the second silicon phosphorous layer extend to a level lower than a top surface of the semiconductor fin, and an entirety of the third silicon phosphorous layer is higher than the top surface of the semiconductor fin. In an embodiment, the second phosphorous atomic percentage is about 11 percent. In an embodiment, in a direction pointing from a first sidewall of the source/drain region close to the first gate stack to a second sidewall of the source/drain region close to the second gate stack, a phosphorous atomic percentage in the source/drain region gradually increases to a highest level, and then gradually decreases from the highest level.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    recessing a semiconductor fin to form a recess, wherein the semiconductor fin protrudes higher than isolation regions on opposite sides of the semiconductor fin;
    performing a first epitaxy to grow a first epitaxy layer extending into the recess, wherein the first epitaxy is performed using a first process gas comprising a silicon-containing gas, silane, and a phosphorous-containing gas, wherein the first epitaxy layer has a first phosphorous atomic percentage; and
    performing a second epitaxy to grow a second epitaxy layer extending into the recess and over the first epitaxy layer, wherein the second epitaxy is performed using a second process gas comprising the silicon-containing gas, silane, and the phosphorous-containing gas, and the second epitaxy layer has a second phosphorous atomic percentage higher than the first phosphorous atomic percentage, wherein the first epitaxy layer and the second epitaxy layer in combination form at least parts of a source/drain region of an n-type Fin Field-Effect Transistor (FinFET), and the source/drain region is between a first gate stack and a second gate stack, and in a direction pointing from a first sidewall of the source/drain region close to the first gate stack to a second sidewall of the source/drain region close to the second gate stack, a phosphorous atomic percentage gradually increases to a highest level, and gradually decreases from the highest level.

2. The method of claim 1, wherein in the first epitaxy, the phosphorous-containing gas has a first flow rate, and in the second epitaxy, the phosphorous-containing gas has a second flow rate equal to the first flow rate.

3. The method of claim 2, wherein the second phosphorous atomic percentage is higher than about two times the first phosphorous atomic percentage.

4. The method of claim 1 further comprising performing a third epitaxy to grow a third epitaxy layer over the second epitaxy layer, wherein the third epitaxy is performed using a third process gas comprising the silicon-containing gas, silane, and the phosphorous-containing gas, and the third epitaxy layer has a third phosphorous atomic percentage lower than the second phosphorous atomic percentage.

5. The method of claim 1, wherein in the first epitaxy, silane has a first flow rate, and in the second epitaxy, silane has a second flow rate higher than the first flow rate.

6. The method of claim 5, wherein in the first epitaxy, the silicon-containing gas has a third flow rate, and in the second epitaxy, the silicon-containing gas has a fourth flow rate equal to the third flow rate.

7. The method of claim 1, wherein the first epitaxy and the second epitaxy are in-situ performed in a same process chamber, and a flow rate of silane is increased from the first epitaxy to the second epitaxy, and wherein flow rates of the silicon-containing gas and the phosphorous-containing gas are kept un-changed.

8. The method of claim 1, wherein the silicon-containing gas comprises dichlorosilane (DCS, H$_2$SiCl$_2$), and the phosphorous-containing gas comprises phosphine (PH$_3$).

9. A method comprising:
    recessing a semiconductor fin to form a recess, wherein the semiconductor fin protrudes higher than isolation regions, and the isolation regions are on opposite sides of the semiconductor fin;
    performing a first epitaxy to grow a first epitaxy layer extending into the recess, wherein the first epitaxy layer comprises silicon phosphorous, and the first epitaxy layer has a first phosphorous atomic percentage; and
    performing a second epitaxy to grow a second epitaxy layer extending into the recess and over the first epitaxy layer, wherein the second epitaxy layer comprises silicon phosphorous, and the second epitaxy layer has a second phosphorous atomic percentage higher than the first phosphorous atomic percentage, wherein both of the first epitaxy and the second epitaxy are performed using process gases comprising a phosphorous-containing gas, and from the first epitaxy to the second epitaxy, the phosphorous-containing gas has substantially a same flow rate, and the second epitaxy layer is selectively grown on the first epitaxy layer without grown from the isolation regions.

10. The method of claim 9, wherein the first epitaxy and the second epitaxy are performed using dichlorosilane (DCS, $H_2SiCl_2$), silane, phosphine ($PH_3$), and HCl.

11. The method of claim 10, wherein the first epitaxy and the second epitaxy are performed with substantially a same flow rate of DCS, and a substantially same flow rate of $PH_3$.

12. The method of claim 11, wherein the first epitaxy is performed with a first flow rate of silane, and the second epitaxy is performed with a second flow rate of silane, and the second flow rate is higher than the first flow rate.

13. The method of claim 10, wherein in both the first epitaxy and the second epitaxy, a ratio of a flow rate of silane to a total flow rate of DCS and silane is in a range between about 0.5% and about 10%.

14. A method comprising:
forming a semiconductor fin protruding higher than isolation regions on opposite sides of the semiconductor fin;
growing a first silicon phosphorous (SiP)-containing layer on a side of, and adjoining, the semiconductor fin, wherein the first SiP-containing layer is grown using a process gas comprising a silicon-containing gas, silane, and a phosphorous-containing gas, and wherein silane has a first flow rate, and the phosphorous-containing gas has a second flow rate; and
increasing silane flow rate to a third flow rate higher than the first flow rate to grow a second SiP-containing layer over the first SiP-containing layer, wherein the process gas comprising the silicon-containing gas, silane, and the phosphorous-containing gas is used, and wherein when the second SiP-containing layer is grown, the phosphorous-containing gas has a fourth flow rate equal to the second flow rate.

15. The method of claim 14, wherein the first SiP-containing layer has a first phosphorous atomic percentage, and the second SiP-containing layer has a second phosphorous atomic percentage higher than the first phosphorous atomic percentage.

16. The method of claim 15, wherein the second phosphorous atomic percentage is higher than about two times the first phosphorous atomic percentage.

17. The method of claim 14 further comprising, after the entireties of the first SiP-containing layer and the second SiP-containing layer are grown to be higher than a top surface of the semiconductor fin, growing a third SiP-containing layer over the second SiP-containing layer, wherein the third SiP-containing layer is grown by reducing the silane flow rate to a fifth flow rate lower than the third flow rate.

18. The method of claim 14, wherein the first SiP-containing layer and the second SiP-containing layer in combination form at least parts of a source/drain region of an n-type Fin Field-Effect Transistor (FinFET).

19. The method of claim 14 further comprising growing a third SiP-containing layer over the second SiP-containing layer using silane with a fifth flow rate, wherein a first ratio of the first flow rate to the third flow rate is smaller than about 0.1, and a second ratio of the fifth flow rate to the third flow rate is smaller than about 0.1.

20. The method of claim 18, wherein the source/drain region is between a first gate stack and a second gate stack, and in a direction pointing from a first sidewall of the source/drain region close to the first gate stack to a second sidewall of the source/drain region close to the second gate stack, a phosphorous atomic percentage gradually increases to a highest level, and gradually decreases from the highest level.

* * * * *